US006327223B1

(12) United States Patent
Elfman

(10) Patent No.: US 6,327,223 B1
(45) Date of Patent: Dec. 4, 2001

(54) SUBNANOSECOND TIMEKEEPER SYSTEM

(76) Inventor: Brian P. Elfman, P.O. Box 748, Alameda, CA (US) 94501

( * ) Notice: Subject to any disclaimer, the term of this patent is extended or adjusted under 35 U.S.C. 154(b) by 0 days.

(21) Appl. No.: 08/874,288

(22) Filed: Jun. 13, 1997

Related U.S. Application Data

(60) Provisional application No. 60/019,798, filed on Jun. 14, 1996.

(51) Int. Cl.[7] .............................. G04F 10/00; G04F 8/00; H03K 3/281; H03K 3/02

(52) U.S. Cl. ............................ 368/113; 368/118; 331/111; 331/143

(58) Field of Search .................................... 368/113, 118, 368/120, 121, 15; 331/111, 143

(56) References Cited

U.S. PATENT DOCUMENTS

| | | | | |
|---|---|---|---|---|
| 3,436,756 | * | 4/1969 | Myers et al. | 368/113 |
| 3,790,880 | | 2/1974 | Doittau et al. | 324/189 |
| 3,970,828 | | 7/1976 | Klein | 235/92 |
| 3,983,481 | | 9/1976 | Nutt et al. | 324/186 |
| 4,090,141 | * | 5/1978 | Leblanc | 368/113 |
| 4,162,443 | | 7/1979 | Brearley | 324/78 |
| 4,164,648 | | 8/1979 | Chu | 235/92 |
| 4,245,335 | * | 1/1981 | Wiesner | 368/82 |
| 4,301,360 | | 11/1981 | Blair | 235/92 |
| 4,407,588 | * | 10/1983 | Arichi et al. | 368/118 |
| 4,419,017 | * | 12/1983 | Okuyama et al. | 368/155 |
| 4,504,155 | | 3/1985 | Ruggieri | 368/121 |
| 4,514,835 | | 4/1985 | Bottigheimer et al. | 368/118 |
| 4,516,861 | | 5/1985 | Frew et al. | 368/120 |
| 4,620,788 | | 11/1986 | Giger | 356/5 |
| 4,736,351 | | 4/1988 | Oliver | 368/118 |
| 4,764,694 | | 8/1988 | Winroth | 307/602 |
| 4,772,843 | * | 9/1988 | Asaka et al. | 320/1 |
| 4,870,629 | | 9/1989 | Swerlein et al. | 368/120 |
| 5,001,683 | | 3/1991 | Fukumoto et al. | 368/113 |
| 5,122,996 | | 6/1992 | Sasaki et al. | 368/113 |
| 5,155,452 | * | 10/1992 | Ueda et al. | 331/111 |
| 5,565,819 | * | 10/1996 | Cooper | 331/111 |
| 5,614,871 | * | 3/1997 | Miyabe | 331/111 |
| 5,760,655 | * | 6/1998 | Roohparvar | 331/111 |
| 5,793,260 | * | 8/1998 | Fawal et al. | 331/111 |

* cited by examiner

*Primary Examiner*—Vit Miska
(74) *Attorney, Agent, or Firm*—C. Michael Zimmerman

(57) ABSTRACT

A timing device for keeping time by marking the time boundaries between contiguous time periods. Time is measured by measuring charging voltage on a pair of capacitances where each capacitance is charged and discharge in successive cycles. Detection of a preset value of potential on each one of the capacitances is used to initiate commencement of charge on the other capacitance and detection of another preset value on the other capacitor is used to record measurement of potential at a full scale potentail point on the one capacitor. By this means "dynamic" measurements of potential are made by which is meant that the potentials are measured while the potential is changing and rather than when the potential has reached a target end point. This technique eliminates errors arising from unstable conditions at the capacitor due to, for example, dielectric hysteresis, a requirement to measure a charging or discharging step simultaneous with a measuring step, etc. Among the various applications of the invention, there is adaptation to a real time clock, calibrated pulses, etc., all involving measurement requiring a high resolution as provided with this invention. In many instances, the resolution required is less than a nanosecond.

25 Claims, 11 Drawing Sheets

CALIBRATED TIMER UNIT (CTU)

SUBNANOSECOND TIMEKEEPER SYSTEM

This Application claims benefit of Provisional application Ser. No. 60/019,798 filed Jun. 14, 1996.

FIELD OF THE INVENTION

This invention relates to the measurement of time and more particularly to electronic time measurement systems employing a timer of sub-pico second ($10^{-12}$ sec. ) resolution and accuracy. A time of day (real time ) clock is derived from the timer.

PRIOR ART AND INFORMATION DISCLOSURE

Various schemes have been devised for electronic timers. Such timers are better described as "time interval meters". In most schemes, the time interval meters have limited range, like a thousand seconds. Conversely, time-of-day clocks rarely have more than a millisecond timing capability. The present limitations of timers and clocks, their shortcomings and deficiencies still exist in the technology.

Specifically, existing timers and clocks simply do not provide approaches for integrating timers and clocks in the sub-picosecond domain. Examples of existing technology are discussed below.

U.S. Pat. No. 3,983,481 to Nutt et al discloses a digital "intervalometer providing a resolution finer than one clock period by charging a single capacitor both during the interval between a start signal and a subsequent clock pulse and also during the interval between a clock pulse subsequent to a stop signal and a delayed stop signal. The analog voltage to which the capacitor is charged is converted to a digital value and then combined with a clock count accumulated between the stop and start signals.

U.S. Pat. No. 4,505,155 discloses a device having a constant current source which charges a reference capacitor by a high speed analog switch when a first event occurs and turning the current off by a second high speed switch when a second event occurs. The voltage produced by the charge on the capacitor is proportional to the time between events.

U.S. Pat. No. 4,162,443 to Brearley et al discloses frequency measurement by counting the number of pulses and the fractional value of an incomplete cycle occurring during a fixed sampling period. The length of the incomplete cycle is measured using a clock pulse having a base frequency multiplied by an integral factor based on the number of complete pulses occurring during the sampling period.

U.S. Pat. No. 4,736,351 to Oliver discloses a microprocessor controlling a programable oscillator directing it to produce pulses of variable width frequency.

U.S. Pat. No. 4,870,629 to Swerlein et al discloses a method of calibration for a voltage to time convertor in order to increment delays by a fraction of a clock cycle.

U.S. Pat. No. 4,772,843 to Asaka et al discloses measurement of a first interpolation pulse extending between a start time and a clock signal and a second interpolation pulse extending from a stop time and a stop interpolation pulse.

U.S. Pat. No. 3,790,890 to Doittau et al discloses a capacitor which is charged during a first time interval which depends on the time interval to be measured and discharged during a later time interval that is multiple of the first time interval and can therefore be measured more accurately than the first time interval.

U.S. Pat. No. 3,790,828 to Klein discloses a system utilizing a fast ramp voltage and a slow ramp voltage starting in unison with the start signal. When the stop signal is received, the first ramp voltage is stopped and the interval of time (clock pulses) emitted until the second ramp voltage is reached is proportional to time between the stop and start signals.

U.S. Pat. No. 4,301,360 to Blair discloses a timing circuit operable at a fast predetermined rate over the time between a stop and start event and operable at slow predetermined rate scaled to the first predetermined rate, between the stop event and the upper limit of a timing window.

U.S. Pat. No. 4,764,694 to Winroth discloses time expansion circuits to expand the initial and final portions of the duration of an event so as to measure more precisely those time segments that are typically not integral numbers of clock periods in length.

U.S. Pat. No. 4,79,798 to Hayashi discloses conversion of the period between stop and start pulses of input pulses into a voltage in which fractional times between pulses are converted by two fractional time to voltage converters, alternately with one another, into voltage signals and the voltage signals alternately applied by a change-over switch to a subtractor taking the difference between the successive fractional times, to create a difference signal. The difference signal is added to the analog signal of the number of clock pulses between the stop and start signals.

U.S. Pat. No. 4,514,835 to Bottigheimer et al discloses a device for measuring time intervals between successive events including a clock pulse generator coupled via a gating circuit to a counter. The output of the counter is connected to a shift register for screening out and storing momentary events of the counter.

U.S. Pat. No. 5,001,683 to Fukumoto et al discloses an inter time difference measuring circuit which expands the time difference between a first pulse and a second pulse by a given multiplication factor and measures the expanded time difference thereby realizing a higher measuring resolution.

U.S. Pat. No. 4,164,648 to Chu discloses measurement of a time interval between a stop and start event by activating a start oscillator in response to the start event and activating a stop oscillator in response to a stop event. The number of cycles of each respective oscillator signal which occurs between activation of each oscillator and the coincidence of the respective oscillator signals is used to determine the time between stop and start events.

U.S. Pat. No. 4,620,788 to Giger discloses apparatus for measuring time delay between start and stop pulse signals comprising a coarse measuring counter that counts the output of a reference oscillator while a fine measurement interpolator determines the residual time between the start pulse and the first oscillator pulse and the stop pulse to the next oscillator pulse.

U.S. Pat. No. 4,772,843 to Asaka et al discloses two time-to-converter which are dedicated to time a start pulse and a stop pulse respectively. The invention is a start pulse and a stop pulse spaced in close proximity in time that can be individually measured without conflict.

U.S. Pat. No. 5,200,933 to Thorton et al discloses a high resolution data acquisition system that incorporates an integrating capacitor whose charging time is proportional to a pulse train, where the output of the capacitor is applied to an A-D converter and expressed into time by processing.

Additional references regarding the present art are to be found in:

W. Weber et al, "Time-to-Pulse Height Converter Measurement of Millimicrosecond Time Intervals", The Review of Scientific Measurements Vol. 27, No. 3 (March, 1956)

J/Kalisz et al, "Error Analysis and Design of the Nutt Time-Interval Digitiser with Picosecond Resolution" J. Phys. E. Sci. Instrum 20: 1330 (1987)

Existing timers and clocks that do have $9^+$ accuracy are large laboratory instruments requiring highly skilled people to calibrate them. As a result, the available equipment is quite expensive.

Because the equipment is not easily transportable, the applied engineering and chemistry field usually do not have daily access to such sophisticated equipment.

Additionally, the calibration of these timer and clock systems must be rigorously monitored. In many instances, calibration of the equipment must be performed in special facilities.

These are only a few of the problems which have not been adequately resolved by existing technology.

SUMMARY

It is an object of this invention to provide solutions and advantages which overcome many of these problems.

This invention is directed toward a system to measure time to $10^{-12}$ seconds. The timer may be integrated into a real time of day clock.

A timing system of this invention includes:

- a calibrated timer unit (CTU) whose unit of time base (pulse length or time between start stop, etc.) is the shortest unit of time of the timer system. This shortest unit of time is referred to herein as a "segment" so that the output of the CTU is one segment or a series of segments;
- a synthesized time base generator (TBG) triggered by arrival from the CTU of a fixed number (n) of segments (referred to herein as a "parcel") and whose output is a clock signal whose time base period is a "transition", each transition having a length of "m" parcels.

In one embodiment, the TBG generates an output of a continuous series of synthesized transitions initiated by a succession of segments from the CTU. In another mode, the CTU measures time interval events having very short periods, for example, one picosecond (1 ps). In another mode, the TBG marks time of arrival of a signal from the CTU initiated by the start and stop signals of an event for measuring real time of the event.

The timing components in the CTU include one pair of capacitors and the timing components in the TBG include another pair of capacitors. Each pair of capacitors has a switching means which alternately connects one capacitor to a charging potential while the other capacitor discharges and then reverses the connections. Each capacitor of each pair charges up to a fixed value while the other capacitor of the respective pair discharges. The first capacitor charges up to a presetpotential which is arbitrarily selected to be (say) one time constant (TC) of the charging circuit. The preset potential is generally about 60% of the potential if the capacitor were fully charged. The charging period of the second capacitor begins when the voltage of the first capacitor reaches a preset fraction of the preselected potential so that the second capacitor begins to charge before the first capacitor starts to discharge. Therefore, each segment begins when the charge voltage across one capacitor reaches the preset potential and the voltage across the other capacitor has increased to a (small) value, generally about ten percent of the preset value. This arrangement reduces errors in establishing starting time due to effects such as might be introduced by dielectric relaxation.

Errors introduced by switch jitter are eliminated by incorporating a delay line to delay the start of the charging cycle after the charging switch has been closed.

The charge voltage of each capacitor is only approximately a linear function of time and corrections for this departure from linearity must be corrected to achieve subnanosecond resolution. This is accomplished according to the invention by first converting the analog voltage value to a digital expression. A lookup table is then used to determine the correct value of time corresponding to the charge voltage.

For time periods in the subnanosecond range, the actual period of each segment (charging time) will vary from a mean value. According to the invention, these variations are accumulated by a microprocessor and are used to correct the starting point of the "latest" segment. The correction algorithm also computes from the error data collected from previous segments an anticipated error of time duration of the latest segment and corrects this latest segment on the basis of the anticipated error.

A third and necessary part of the timer system of this invention is the use of a calibration device of this invention for calibrating the CTU A calibration standard is provided in the form of a pair of light wave guides (tubes), one having a length different from the other. Each tube is positioned in line end to end with the other tube. A spark source such as a light emitting diode is positioned between the neighboring ends of the tubes. A pair of optical detectors are provided with one optic detector positioned at the end of each wave guide opposite the spark source. Each spark generates a start signal in the optic detector proximal to the shortest tube and a stop signal in the other optic detector proximal to the end of the longest tube. The output is fed respectively to the start and stop connections of the CTU.

While the foregoing paragraphs provide an overview of general principles of the invention, the following section including a description of the drawings presents in detail examples of what is presently believed to be the best mode for carrying out the invention.

BRIEF DESCRIPTION OF THE DRAWINGS

FIG. 3A shows the charge curve voltage vs. time of a charging capacitor.

LIST OF ABBREVIATIONS ps - - - picoseconds

CTU - - - calibrated timer unit

BTG - - - time base generator $DAC_{FSA}$ - - - Digital to analog converter, full scale, section A, $T_0$ - - - starting instant $T_{FS}$ - - - instant at full scale T - - - time from start ($T_0$) to finish ($T_{fs}$)

SSP - - - segment and parcel processor $T_{CC}$ - - - time (instant) to start charging a complimentary capacitor.

$C_{TA}$ and $C_{TB}$ - - - two complimentary capacitors of the CTU $C_{TAA}$ and $C_{TBB}$ - - - two complimentary capacitors of the BTG TC - - - time constant SPP - - - segment and parcel processor ADC - - - analog to digital converter TPU - - - timer processor unit S - - - switch PDE - - - precision delay envelope ZCP - - - zero clock point

DESCRIPTION OF BEST MODES

Figure 1:
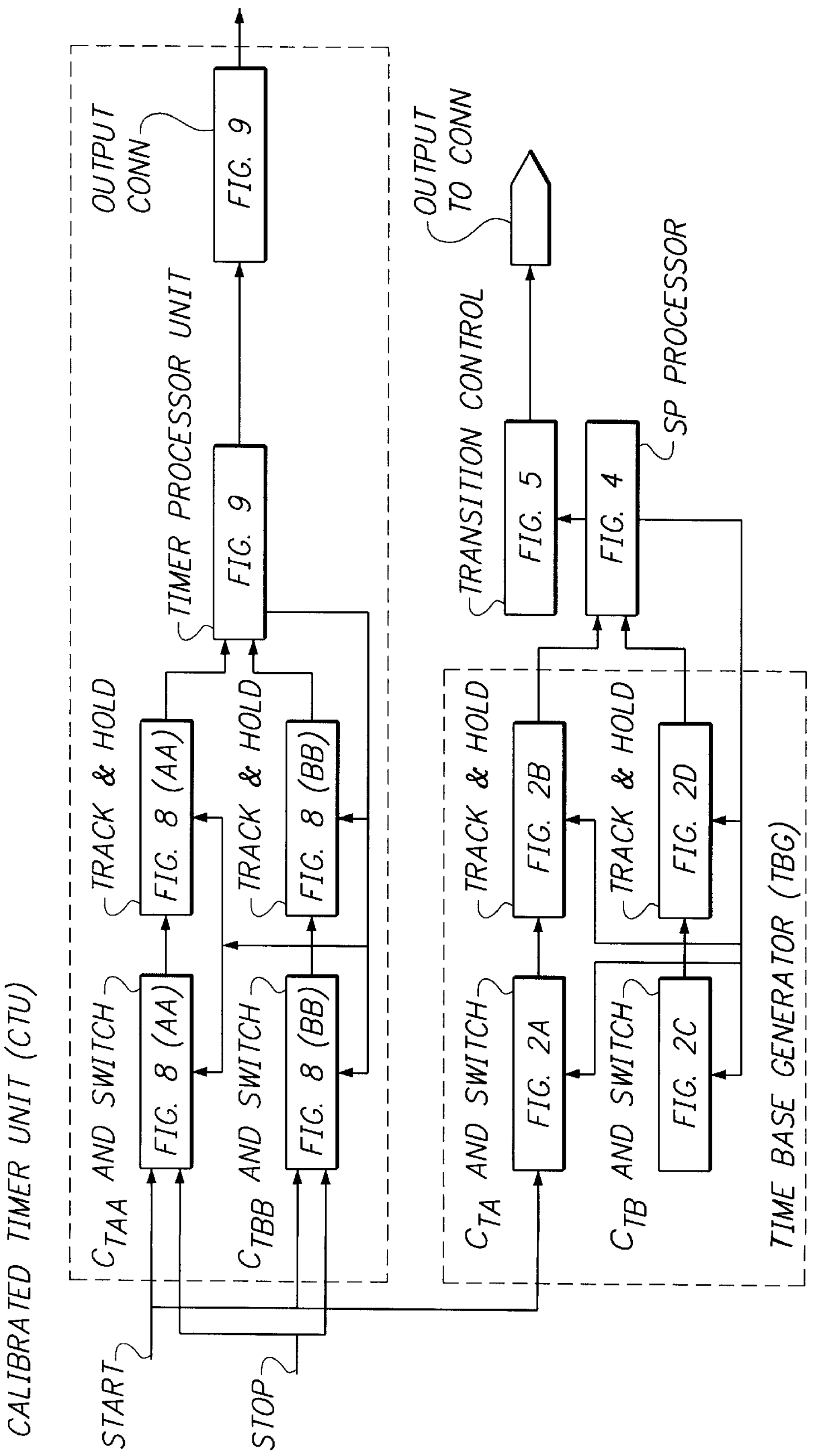
FIG. 1 shows a block diagram of the timer system of the invention.

Referring to FIG. 1, the Block Diagram shows a Calibrated Timer Unit, which is designated as the CTU, and a synthesized Time Base Generator, which is designated as the TBG. FIG. 1 may be a TIMEKEEPER INSTRUMENT that consists of a time base generator unit, the TBG, and a subnanosecond calibrated time interval meter unit, the CTU.

In the TIMEKEEPER INSTRUMENT, the output of the time base generator unit may be used for either electromechanical or electronic time keeping, for example, a precision real time clock or watch, which can be in the form of any size or shape. It may be used to time or othenvise pulse an electronic or optoelectric circuit.

The time base generator unit may have a time continuous series output of synthesized transitions, but nonetheless the time interval meter unit (the cablibrated timer unit) may measure time interval events to very short periods like 1 picosecond (ps) resolution with a half ps accuracy. The time base generator unit provides means for marking time from the time interval meter unit for combining real time with a start of time measurement of an event.

Although the time base generator unit and the time interval meter unit can share a common set of timing components, in this embodiment, each unit is configured with a separate or dedicated set of timing components. Thus in still another version, the time keeping instrument may consist of either the time base generator or time interval meter, but not both.

The timing components may be configured in the time base generator unit to run in two modes of operation, CALIBRATION and RUN. In RUN, operation may be real time and may be long term over days or weeks or months or years.

The timing components of the time interval meter unit may be configured to run in three modes of operation. CALIBRATION, STANDBY and MEASURE. STANDBY is switched to MEASURE by way of a START signal, which can be marked contemporaneously to a point of the time base generator unit. By this method, the user may have a real time reference synchronized to the time of the event. When the instrument receives a STOP signal it switches the time interval meter back to STANDBY. In this instrument, one of the differences between the CTU and the TBG are the means of tracking their respective time keeping function.

TBG time keeping is based on a hierarchy of time cells (a period of time). The basic time cells are SEGMENTS, represented as a monitored charge of the timing capacitors. Thereafter are PARCELS, represented as a series of SEGMENTS. Finally, output voltage TRANSITIONS are generated every nth Parcel is given special calibration attention as to both time and voltage. This function dealing with precision time and voltage is defined as a synthesized TRANSITION. The nth PARCEL may be user selected, for example, the user can switch between a transition every 10 microseconds ($\mu$s) or every 100 $\mu$s. This gives the user a choice of resolution for application to real time events.

CTU time keeping in the most preferred embodiment is based on SEGMENTS accumulation like the TBG, however, PARCELS and TRANSITIONS are not utilized. In another embodiment PARCELS or TRANSITIONS can be optionally added.

Definitions

Designations assigned to the components used in this description and drawings are called out by device with a subscript function, for example. $DAC_{FS}$. The TBG and the CTU each contain a set of identical front end components. These sets are divided into 2 sections—A or B in the TBG; and AA or BB in the CTU. An alpha character; A or B, or AA or BB; may be added to the subscript, for example, $DAC_{FSA}$.

Additionally, DEVICE-FUNCTION without SECTION designators, for example, $DAC_{FS}$ instead of $DAC_{FSA}$, are to be read as if the related subject-matter is common or is repeated for both section A and for section B. This scheme follows for the CTU, for example, $DAC_{FS}$ instead of $DAC_{F-SAA}$.

Where the functions of components and signals in the TBG and CTU are identical assignments are given in like designators. So that S1A serves the same function as S1AA in their respective circuits.

The segment (a period of time) is measured from the point of $T_0$ ("Tee-zero") to $T_{FS}$ ("Tee-Full Scale"). T ("Tee") denotes TIME. "Zero to Full Scale" is defined as that portion of a voltage charging on a timing capacitor representing a time period. In one preferred embodiment, a number of nanoseconds (ns). Other measurement designations utilized in this description are; $T_{cc}$ ("Tee-complimentary capacitor"), the point of measurement used to start a new complimentary capacitor charge which corresponds to $V_0$ ("Vee-zero"); $T_{TCU}$ ("Tee-time base generator") is the point of time corresponding to a START signal received by the TCU.

DETAILED DESCRIPTION

SEGMENTS are generated by the synchronized charging of one or more timing capacitors. In the most preferred embodiment, two capacitors $C_{TA}$ and $C_{TB}$ are utilized to generate SEGMENTS in a sequence as represented generally in FIG. 3B. Such synchronized charging and discharging of $C_{TA}$ to $C_{TB}$ and back to $C_{TA}$ is continuous. In another embodiment, the discharge cycle may be utilized. However, in this preferred embodiment the discharging of either timing capacitor shall be assumed to precede its charging cycle.

The sharpness or acuity of time in synchronizing the charging of $C_{TA}$ to $C_{TB}$ and back continuously is defined as the measure of contiguity. Before getting further into contiguity, the basic timing sequence $C_{TA}$ and $C_{TB}$ follows.

Figure 7:
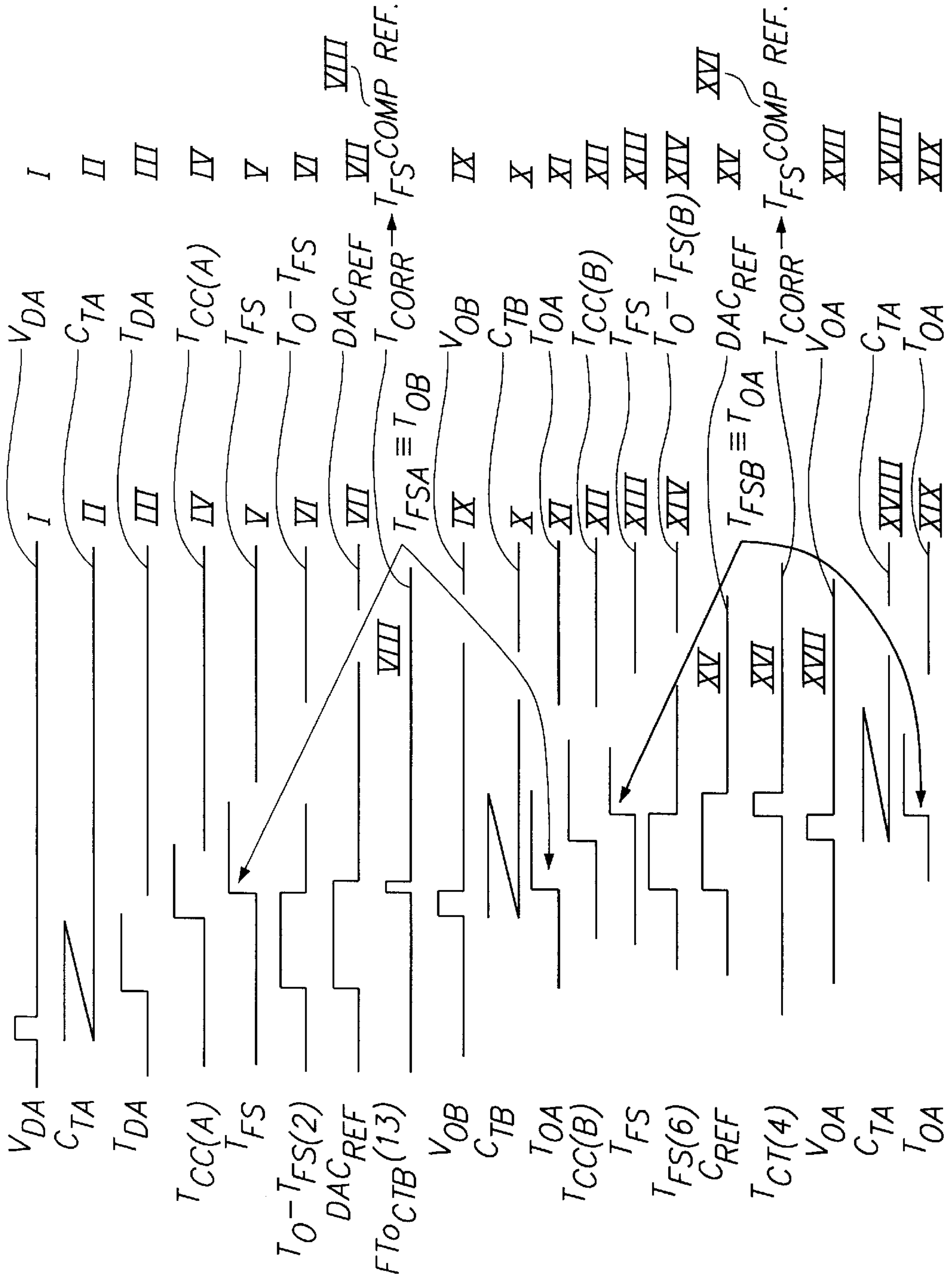
FIG. 7 is a timing diagram showing relative locations in time of voltage across timing components.

Alternate embodiments of the Timing Sequence Function FIG. 7

FIG. 3A is a V vs. T plot representing the voltage charge on $C_T$. V denotes voltage and T denotes time; unless otherwise specified. The voltage charge is exponential in nature. Accordingly, the curve starting at VT in FIG. 3A is an exponential plot of $1-\epsilon^{-x}$. The symbol $\epsilon$ is the Greek character "epsilon". Shown are grid lines denoting 1 Time Constant (TC), 2TC and 3TC. A TC is a unit of measure referenced herein as a percentage of the applied voltage across the capacitor.

An exponential voltage charge plotted to $1-^{-x}$ is close to being linear in time through 1TC. Nevertheless, accuracy in the subnanosecond range requires an exponential voltage to linear time conversion or equivalent function. Since conversion goes from a voltage data quantity, $V_{CT}$, to a time data quantity, T, then in this embodiment, $T_0-T_{FS}$ is composed of two data quantities, V and T and are generally set in calibration; There are various methods known to the art for how to set $V_{CT}$; in any event, $V_{CT}\approx 5$ TC.

where: $T_0-T_{FS}$=>[is derived from] $V_{FS}*(1-\epsilon^{-x})$

So that $V_{CT}$, the applied voltage across the timing capacitor, sets $V_{FS}$ at 1TC; thus x=1; to the desired $T_0-T_{FS}$ voltage spread. For example;

If $V_{FS}$ sets a 100 ns (T being one data quantity) voltage range of $T_0-T_{FS}$ to 10 V (V being the other data quantity), then the $1-\epsilon^{-x}$ plot to time would be, (all figures approximate); 1.5 volts=$T_0$; 4.7 volts=24 ns; 7.2 volts =47 ns; 8.2 volts=$T_{CC}$ (59 ns) 9.2 volts=71 ns and 11 volts=$T_{FS}$. For descriptive convenience here, $T_0$ is set at time rather than a % of 1TC; so that $T_0$ is set at 10 ns from $V_0$, which $T_{FS}$ follows at 110 ns and 1TC would be about 115 ns. However in the timing description below, $T_0$ is described as a preferred embodiment by % of setting. The data quantities V-T may be modified for two time constants $(1-\epsilon^{-2})$ or three time constants $(1-\epsilon^{-3})$ or even to five time constants $(1-\epsilon^{-5})$. 1 TC is preferred and utilized in this description.

Figure 4:
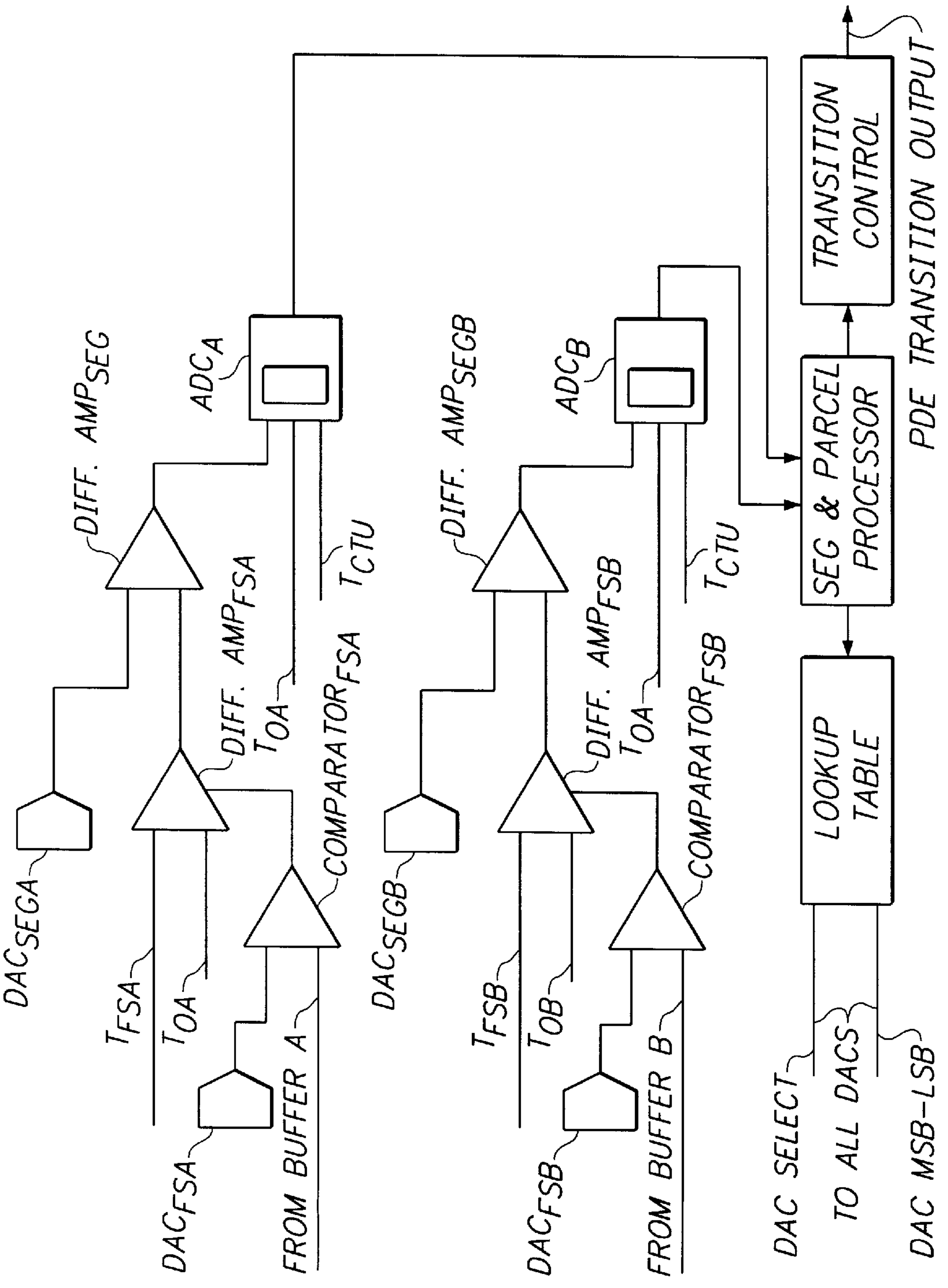
FIG. 4 shows the circuit for converting the time signal from analog to digital preparatory to applying the digitized value to the lookup table.

In one preferred embodiment, voltage charges from $C_{TA}$ and $C_{TB}$ are converted from an exponential voltage plot to linear time following such voltages being digitized as shown in FIG. 4, further described in detail below. Accordingly, the resolution of an exponential plot to linear time conversion is determined by the digital data quantity $2^n$ bits that are resident to the A to D device employed. Thus, a conversion can be fabricated in the form of a LOOK UP TABLE based on the number of increments determined by the $2^n$ combinations, FIG. 4.

Figure 3B:
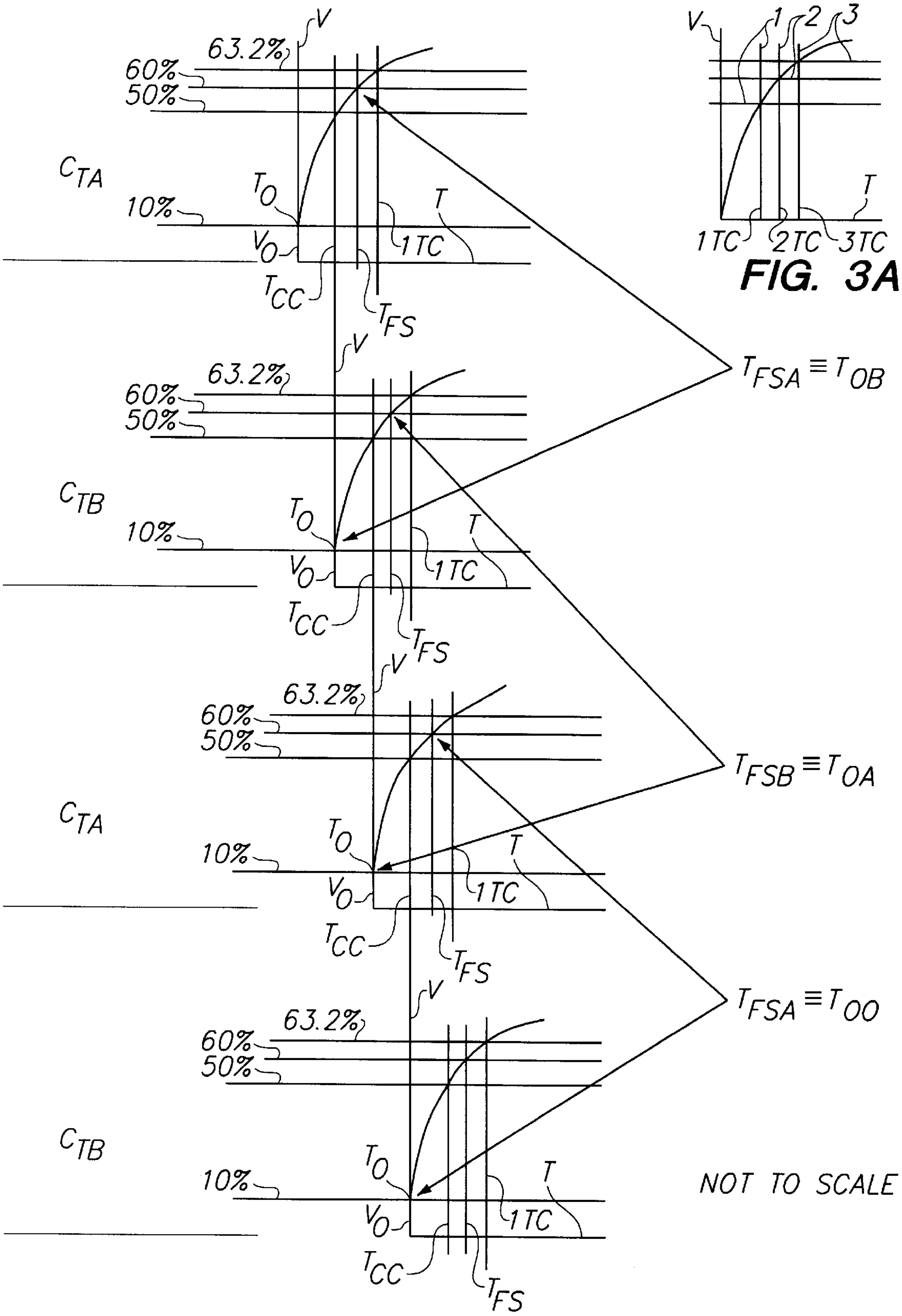
FIG. 3B shows the time relation ship between the charging voltage of the two capacitors.

FIG. 3B shows four T vs. V exponential plots representing a time series of voltage charges alternating between $C_{TA}$ and $C_{TB}$. The points of measurement along the exponential curve are shown as a percentage relative to 63% or about 1TC. These percentages are ideal. Ideal is also most preferred. That is, the point of measurement to which calibration may be made, but operation of $C_{TA}$ and $C_{TB}$ are conceived to be nearly ideal. That is, ideal can also be read as nearly ideal.

In RUN mode of the TBG, the points of measurement of $T_{CC}$ and $T_{FS}$ are controlled by the SEG.&PARCEL PROCESSOR (SPP) and will therefore vary higher or lower than the ideal percentages shown in FIG. 3B. Referring to FIGS. 3B, 4; $T_{CCA}\equiv T_{0B}$; $T_{FSA}\equiv T_{0B}$; $T_{CCB}\equiv T_{0A}$; and $T_{FSB}\equiv T_{0A}$; so that SPP control of $T_{CC}$ and $T_{FS}$ essentially controls all points of measurement. Note that the symbol ± in this description reads ideally identical, as the term ideal is defined in the above paragraph, so that ideally identical can also be read as nearly ideally identical.

These points of measurement apply to the CTU as well. So that $T_{OA\ or\ B}$, $T_{CCA\ or\ B}$, and $T_{FSA\ or\ B}$ are functionally the same as $T_{OAA\ or\ BB}$, $T_{CCAA\ or\ BB}$, and $T_{FSAA\ or\ BB}$ respectively. The TIMER PROCESSOR control of $T_0$, $T_{CC}$, and $T_{FS}$ corresponds functionally to the SPP control of these points as described herein, unless otherwise specified. Accordingly, $C_{TA\ or\ B}$ corresponds functionally to $C_{TAA\ or\ BB}$ in the description herein, unless otherwise specified.

FIG. 3B shows the points along the exponential plots of; 0%, designated as $V_0$; 10%, designated as $T_0$; 50%, designated as $T_{CC}$; 60%, designated as $T_{FS}$; and 63% around which resets are structured to prepare $C_T$ for the next cycle; are shown in each of the five plots. Accordingly, FIG. 3B is representative of 4 SEGMENTS.

Figures 2A, 2B, 2C, 2D:
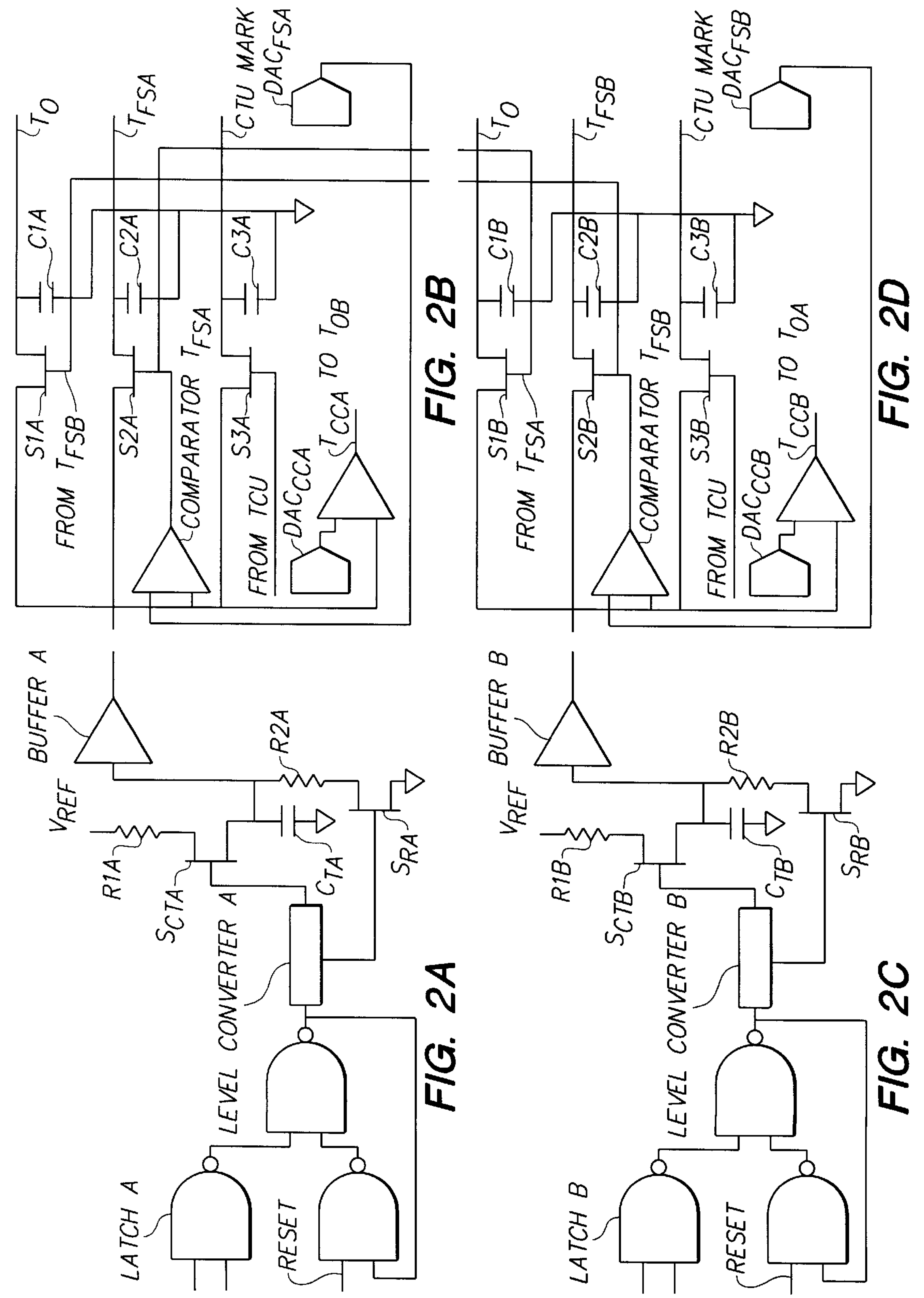
FIGS. 2A and 2B show the drivers for charging the timing capacitors.
FIGS. 2C and 2D show the charging circuits for the timing capacitors.

FIG. 2A is the circuit configuration for $C_{TA}$ and connects to FIG. 2B. FIG. 2C is the circuit configuration for $C_{TB}$ and connects to FIG. 2D. The $C_{TA}$ and $C_{TB}$ circuit configurations are identical. Starting with FIG. 2A, $C_{TA}$ will be charged through R1A when $S_{CTA}$ is switched ON by LATCH A. A complimentary level converter, LEVEL CONVERTER A drives the gate of $S_{CTA}$ to ON and its compliment drives the gate of $S_{RA}$ to OFF. FET Switch $S_{RA}$ holds $C_{TA}$ at 0 volts through R2A when it is switch to ON, and is how $C_{TA}$ is reset. See Table 1 for devise function assignment.

TABLE 1

DEVICE FUNCTION ASSIGNMENT
Exampled Point of Measurement Time Sequence of Two SEGMENTS

| Point of Voltage Charge | Time (FIG. 3B) | Components (FIGS. 2A–D) |
|---|---|---|
| 1. $V_{0A}$ of $C_{TA}$ | None measured at this point | $DAC_{CCB}$ - $Comparator_{CCB}$ sets LATCH A - Set by POINT No. 8 |
| 2. 10%(ideal) of $C_{TA}$ | $T_{0A}$ | Comparator $T_{FSB}$ switch S1A OFF Set by POINT No. 9 |
| 3. 50%(ideal) of $C_{TA}$ | $T_{CCA}$ | $DAC_{CCA}$ - $Comparator_{CCA}$ sets LATCH B |
| 4. 60%(ideal) of $C_{TA}$ | $T_{FSA}$ | $DAC_{FSA}$ - $Comparator_{FSA}$ switches S2A to OFF and switches S1B to OFF |
| 5. 63%(ideal) of $C_{TA}$ | $T_{RST}$ | Reset LATCH A and turns $S_{RA}$ ON |
| 6. $V_{0B}$ of $C_{TB}$ | None measured at this point | Set by POINT No. 3. |
| 7. 10%(ideal) of $C_{TB}$ | $T_{0B}$ | Comparator $T_{FSA}$ swith S1B OFF Set POINT No. 4 |
| 8. 50%(ideal) of $C_{TB}$ | $T_{CCB}$ | $DAC_{CCB}$ - $Comparator_{CCB}$ sets LATCH A |
| 9. 60%(ideal) of $C_{TB}$ | $T_{FSB}$ | $DAC_{FSB}$ - $Comparator_{FSB}$ switches S2B to OFF and switches S1A to OFF |
| 10. 63%(ideal) of $C_{TB}$ | $T_{RST}$ | Reset LATCH B and turns $S_{RB}$ ON. |

The TABLE 1 also applies to the CTU, where the device A or B, for example S2B, corresponds functionally in counterpart to the device AA or BB, for example S2BB and so forth.

Alternate Versions of Functions and Devices

A component suitable for use as timing capacitor $C_T$ is available as A91D151BSW from Component Research Co. Inc. of Santa Monica, Calif. This capacitor is a 1/4%, Teflon NPO. This supplier offers a matching service. $C_{TA}$ and $C_{TB}$ may be a matched pair, which is a preferred embodiment. A device suitable for use as BUFFER A & B is available as AD9620 from Analog Devices, Inc. of Norwood, Mass. Also from Analog Devices are suitable devices for use as a COMPARATOR, the AD96685; and a SAMPLE AND HOLD, the AD9100. Here, the AD9100 is an alternative device to the configuration of FET switch and capacitor shown in FIGS. 2B and 2D.

A device suitable for use as FET GaAs switches is available as AF002C4 from Alpha Industries, Inc. of Woburn, Mass. The circuit for a complimentary level converter is given at page AN13–32, of the Linear Technology Corp. 1987 *Linear Applications Handbook,* which is incorporated herein by this reference.

In a working example of a preferred configuration, $C_{TA}$ and $C_{TB}$ are 150 pf. R1A and R1B are precision series resistors and may be matched. For calibration, R1 can be arranged into a precision fixed resister and a precision trimming resistor (potentiometer or pot). So that to realize 10V full scale from $T_0$ to $T_{FS}$, $V_{REF}$ will be in the range of 15–25V. A 100 ns ideal SEGMENT from $T_0$ to $T_{FS}$ results in R1 (Fixed) in the range of 600Ω and a series pot in the range of 250 Ω. The voltage of $V_{FS}$ can be set by the trimming pot as is described in the example above.

In FIGS. 2A, C; $V_{REF}$ is a precision voltage reference further trimmed for additional accuracy and stability. $V_{REF}$ can be any power supply required by the components in the circuit. A series of suitable voltage references devices are available from Burr-Brown of Tucson, Ariz. with the designator prefix REF, for example the REF02. It may be assumed that $V_{REF}$ powers all devices described herein, unless otherwise specified. The REF02 specification sheet suggesting applications shows how the FEF02 can be configured for higher voltages than 10V by stacking devices as well as for negative voltages.

Also in FIGS. 2A, C, the holding capacitors C1-3A and C1-3B are preferred in the range of 10 pf–30 pf. The optimum values for a custom chip containing all the circuitry will require an appropriate set of design rules for semiconductor chips. For off-the-shelf components, The optimum values may be established by determining the range of capacitive load on the BUFFER for accuracy-to-time against the "droop" factor, that is the loss of voltage during processing of the data after the FET switch is switched to OFF. Droop is a parameter commonly found in specifications of SAMPLE AND HOLD devices. Also see p.4–5, *Data Converter Reference Manual* Vol II, 1992 by Analog Devices and is incorporated herein by reference.

Component Research Co. is also a source for polyethylene and polystyrene precision capacitors under 100 pf. An alternative to purchasing C1-3A&B, is constructing a single enclosure containing the six capacitors. One preference is a form of a capacitor that uses a small sapphire disk. This type of capacitor can be constructed by affixing a metal foil with leads attached on both sides of a sapphire disk substrate. For a value in the range of 10 pf–30 pf., the sapphire substrate disk will have a diameter of under 12 mm and under a mm in thickness. One source with a line of sizes of suitable sapphire substrates is Swiss Jewel Company of Philadelphia, Pa. Each capacitor is placed in a stack with an insulator between each capacitor.

Each set of two leads to the six capacitors are dressed through the enclosure. Before sealing the enclosure, it is flooded with a thermal viscous compound and then sealed. Teflon is suitable for the enclosure and insulator One source for thermal viscous compounds is Dow Corning's silicone bath fluids with viscosities from 1.6 centistokes (cs) to 500 cs.

Now going to FIG. 4. Both $ADC_A$ and $ADC_B$ mutiplex three inputs of their respective $C_T$ circuitry as shown in FIG. 4. These three inputs are: the output of Diff.Amp.$_{SEG}$, TCU mark and buffered $T_0$. In an alternate configuration, the SPP can monitor a fourth data quantity; $T_{CC}$. Referring to FIGS. 2A & 4, at $T_{OA}$, the voltage at C1A (FIG. 2A) is measured by $ADC_A$ (FIG. 4) through BUFFER A. The $ADC_A$ output of digital data is represented as MSB-LSB and is further communicated to the SPP as shown in FIG. 4. The SPP in turn uses the ADC output to maintain accounting of time by control of $T_{CC}$ and computing number of PARCELS between TRANSITIONS. In a preferred embodiment, the ADC will have sufficient resolution timing in the range of 0.5 ps.

FIG. 2B. A suitable integrated circuit device for ADC operation is the AD9060 from Analog Devices, Inc. of Norwood, Mass. Various combination configurations for arranging of two ADCs to increase resolution are known to persons skilled in the art. For example, see the application section of the specification sheet to the CA3318 from Harris Semiconductor of Melbourne, Fla. As another alternative, high speed hybrid ADC devices are also available from companies specializing in high speed ADCs. Hybrids are frequently designated by the user and an approach to obtaining a suitable device is to utilize an industry listing publication. One industry directory listing sources of hybrid circuit suppliers is the 95-96 EEM from Hearst Business Communications, Inc. of Garden City, N.Y.

The preferred version of the SPP is based on a hardware-software combination. The LOOK UP TABLES perform high speed conversions. The SPP software supervises the ADCs; the accounting of SEGMENTS, PARCELS and TRANSITIONS; setting the DACs; and the general "housekeeping" chores, like watchdog timers, interrupts, and power management of the power supplies. The software will support the functions contained in this description of the various embodiments. Another version of the SPP may be FIELD PROGRAMMABLE LOGIC GATES; with readily available off-the-shelf devices available. In any event, the SPP is functional to the embodiments described herein.

Figure 11:
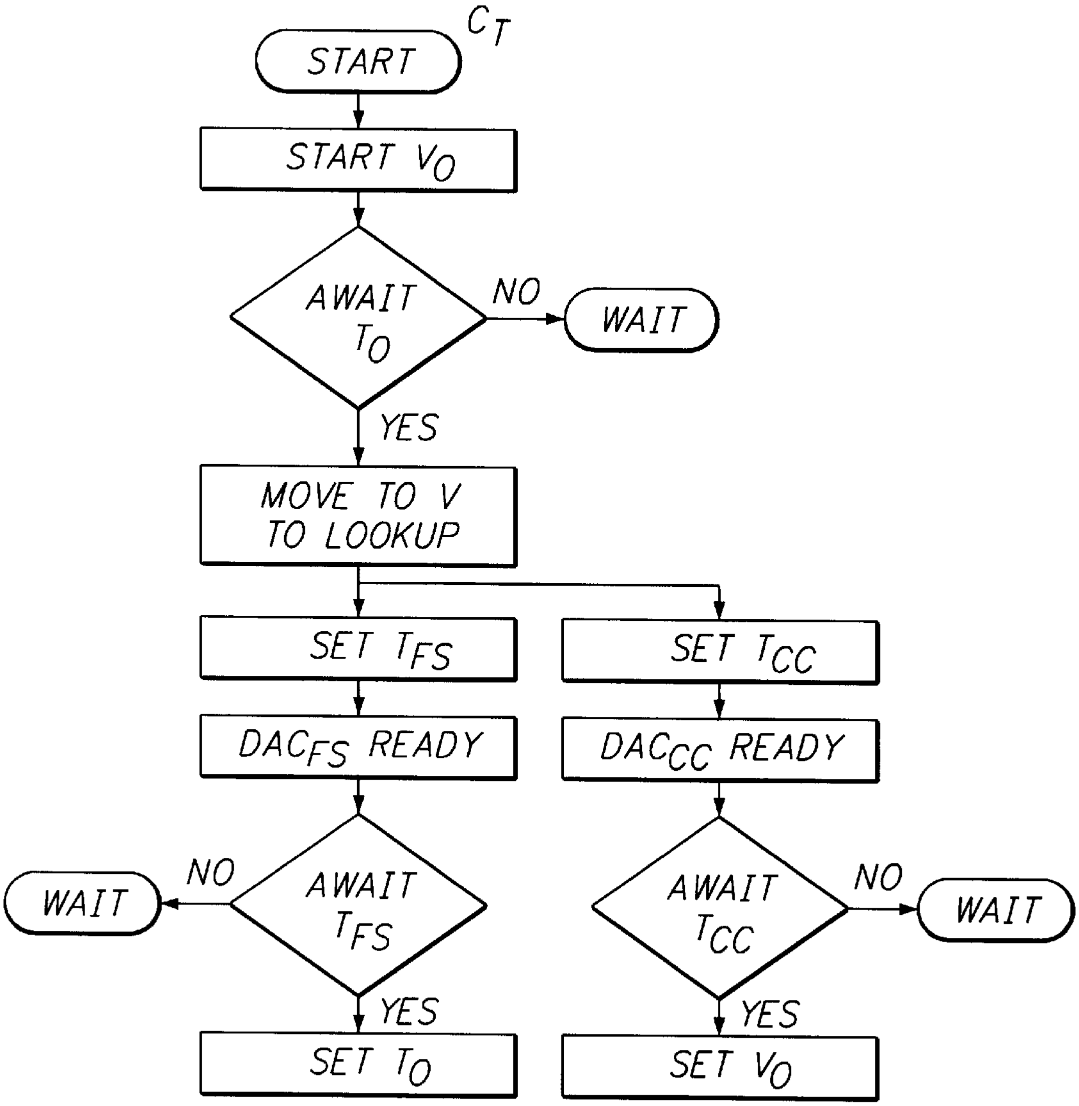
FIG. 11 shows the steps in the calibration method.

A Preferred Embodiment Describing Control of Points in Timing Sequence. FIG. 11

Referring to Table 1, The ideal points of measurements are varied along the exponential voltage charge to account for time deviations determined by comparing $T_0$–$T_{FS}$ to a preset DAC of the desired time of SEGMENT. Since $T_{CC}$ sets the $V_0$ of the following SEGMENT, and since $T_{FS}$ sets $T_0$ in the same SEGMENT following the $V_0$ just set by $T_{CC}$, variations of $T_{CC}$ and $T_{FS}$ control making up for time deviations. The SPP controls varying $T_{CC}$ and $T_{FS}$. In this description, deviation is defined as a sum of measured voltage variations with or without statistical inference. Accordingly, deviation shall mean without statistical inference unless other specified.

Put another way, the purpose of varying the point of $T_{CC}$ is to adjust the point that $V_0$ will be initiated so as to effectively move the point of $T_0$ without violating $T_{FS}$≡$T_0$. Because $T_{FS}$ must always be ideally identical to $T_0$ of the following SEGMENT, the SPP must monitor the $T_0$ point of measurement continuously to ensure this point does not deviate or precess too far from its ideal point of measurement.

Going on with FIG. 4, The SPP varies the measurement point of $T_{CC}$ to effect adding or subtracting time using a LOOK-UP TABLE. Thus, the anticipated $T_0$ can be varied, based on the ideal point of measurement of $T_{CC}$ being modified, so that $V_0$, the point at which $C_T$ will initiate a new voltage charge, is moved in time either forward, backwards or not at all. As an example, refer to FIG. 3B. examining the top plot, $T_{CCA}$ is shown at its ideal point, 50%. now were $T_{CCA}$ measured at a point below the 50% point, then $V_{0B}$ will occur earlier in time. Therefore $T_{0B}$ would be measured at a higher voltage charge in respect to the $T_{CCA}$ 50% point, because $C_{TB}$ would have started its voltage charge sooner.

Now where the updated $DAC_{CCA}$ induces $T_{CCA}$ to be measured above its deal 50% point, then $C_{TB}$ will start its $V_0$ at a later time as summarized in TABLE 2.

TABLE 2

| Where $T_{CC}$ is updated | Result: For $V_0$ | For $T_0$ | For $T_{FS}$ |
|---|---|---|---|
| Below 50% | Earlier | Increases length of SEGMENT | |
| Above 50% | Later | Decreases length of SEGMENT | |

Above was described how the SPP operationally moves points of measurement along the exponential charge plot, and thus are moved in time. Now described below is how the SPP operationally applies such movement of points of measurement to maintain a high degree of contiguousness between $C_T$ to $C_T$ and back continuously.

FIG. 4 Embodiment to Resolve a Segement

FIG. 4 shows the two step process of $DIFF.AMP_{FS}$ through $DIFF.AMP_{SEG}$ to subtract the ideal SEGMENT from the actual SEGMENT. The resultant difference in voltage being the time deviation. The functions $DAC_{FS}$ and $COMPARATOR_{FS}$ which are shown in FIG. 2 are repeated in FIG. 4 to facilitate this description.

In operation, the differentiated $T_0-T_{FS}$ is compared to the calibrated ideal time period by $DAC_{SEG}$ and $Diff.Amp_{SEG}$ in FIG. 4. This difference is then digitized as the time deviation by the ADC. This can be further illustrated by an example. Referring back to the 100 ns–10V embodiment Exampled above, the target resolution of 0.5 ps across the entire 10V range of the 100 ns SEGMENT would require the need for an 18 bit $DAC_{SEG}$. However, the ADC, only needs to resolve by differentiation of the measured signal, $T_0-T_{FS}$, to the calibrated reference, $DAC_{SEG}$, consequently a relatively small differential voltage results at the output of $DIFF.AMP_{SEG}$.

To illustrate how the function to further accuracy is derived from the relatively small differential voltage output, an example of a hypothetical deviation will be assumed. Assume that the difference at the output of $DIFF.AMP_{SEG}$ in FIG. 4 is 100 millivolts (mv). Further assume this works out to a 0.1% deviation or a time of approximately 0.1% of 100 ns or 100 ps. The time deviation is approximate because the voltage charge is plotted to $1-\epsilon^{-1}$, that when converted from exponential to linear, the 100 mv difference is equal to a time of about 99.5 ps.

Now the hypothetical 100 mv deviation is digitized by the ADC so that the SPP will be able to deal with updating the $DAC_{CC}$. Referring to the AD9060 specifications, the 10 bit device will resolve 1.7 mv. Now the 18 bit $DAC_{SEG}$ produces about a 0.16 mv resolution. This means that a gain of about 10 must be set in the $DIFF.AMP_{SEG}$. for the 100 mv signal to be resolved to the same level as the 18 BIT $DAC_{SEG}$ was calibrated.

Thus, the gain shown in the above hypothetical example fits this 10 bit ADC for a resolution of the quantitative time path—that path of the time data quantities from $C_T$ to the ADC—of about 1 part in 200,000 or 0.5 ps. So that assuming a gain accuracy of 0.01% of the $DIFF.AMP._{SEG}$, the 1 part in 10,000 should not have a significant impact on quantitative time path resolution. That is, because the error rate is less than half of the resolution of the ADC. A device suitable for $DIFF.AMP._{SEG}$ is the AD830 from Analog Devices, Inc. of Norwood, Mass.

Most Preferred Embodiment to Supervise Contiguity

Referring to FIG. 3B, that part of the voltage charging sequence related to contiguity is shown. The bold arrows are denoted either $T_{FSA}≡T_{0B}$ or $T_{FSB}≡T_{0A}$. How identical $T_{FS}$ is to $T_0$ determines the seamlessness between SEGMENTS, that is, the degree of contiguity, which is a parameter defining what time may be unaccounted for from $T_0$ to $T_0$.

Therefore, contiguity is a parameter which impacts directly the accuracy of time keeping. Contiguity is further explained as illustrated in FIGS. 2B & 2D. Here inputs to Buffer Amps A & B are taken from FIGS. 2A & 2C respectively at $C_{TA}$ and $C_{TB}$. Now assume that $C_{TA}$ is charging in accordance with the top plot in FIG. 3B; $C_{TB}$ is started by the function $T_{CC\ from\ CTA}$ to $C_{TB}$ as denoted by the bold line connecting the two plots marked V.

Contiguity is composed of identifiable data quantities. Two of these identifiable data quantities are first, time deviation by a cumulative variance of voltage measurements over any number of $C_T$ charges, henceforth denoted as contiguous stability. Second, a quantity of time beyond the resolution of the timing instrument, henceforth denoted as contiguous uncertainty or simply stability and uncertainty, unless otherwise specified.

Now the SPP determines what new value of voltage output to set $DAC_{CC}$ and $DAC_{FS}$ in the course of timing a SEGMENT. First, at $T_0$ a value for $DAC_{FS}$ is acertained from a SEGMENT time ($T_0-T_{FS}$) to voltage (V) conversion. As described above, the SEGMENT time to voltage conversion values are digitally stored within a LOOK UP TABLE. Once the point of $T_{FS}$ is determined for the SEGMENT by the SPP, then the point $T_0$ of the following SEGMENT can be arbitrated by where $T_{CC}$ is set. That is; Above there was described that $T_{CC}≡V_0$;

There is a point $V_0$ for every value of $T_{CC}$, and;

Above there was described ideal that $T_0$ is 10% of $V_0-V_{FS}$;

There is a point $T_0$ for every value of $V_0$.

Wherefore, new value $DAC_{CC}$ sets the point at where $T_0$ in the following SEGMENT will occur. The term "every value" used in the preceding statements means such values as will be appropriate in the range of the ideal point as described above.

A LOOK-UP TABLE, shown in FIG. 4, stores data quantities for making the conversion from $T_{FS}$ to $V_0$ to $T_0$ in which contains every point of $T_{CC}$. Recalling that noted in the $T_0-T_{FS}$ 100 ns at 10V example above, that 10 ns was utilized for setting $T_0$, instead of ideal 10%, so that at the 8.2 volt point, the ideal $T_0$ point is $V_0$+10 ns. Now carrying the 100 ns example to conversion, a LOOK UP TABLE contains a range of digitized voltages around the 8.2 volt point, which would make up an array of data quantities, $V_0$, which may be defined as containing every point of $T_{CC}$.

Figure 5:
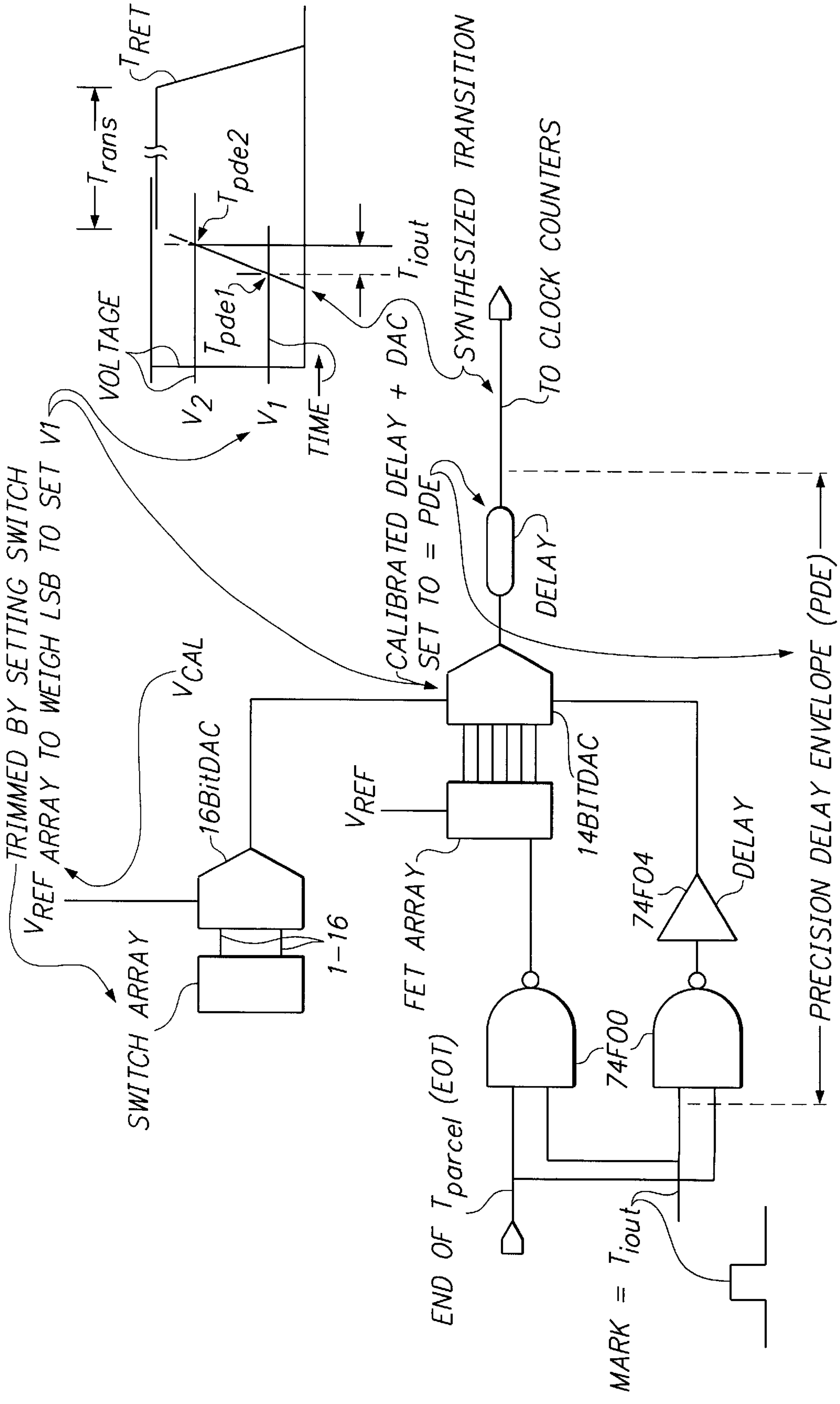
FIG. 5 shows details of the transition control.

Embodiments of the Transiton Control FIG. 5

When the SPP has determined the number of PARCELS that was user selected for a TRANSITION, whatever time deviations may be remaining at the point a TRANSITION is synthesized, such remaining time deviations are carried to the next PARCEL. While the time deviations are carried to the next PARCEL, the time deviations contain information relevant to the TRANSITION in process and may also be presented in communicable form in parallel output. Thus, the user may wish to have the time deviations either canceled by appropriate delays, communicated to the output of the instrument vial a digital connector; or simply ignored.

In a preferred embodiment, the SPP will output the deviation through the digital connector. For example, the SPP could find a 673 ps time deviation, or it could find a 1036 ps time deviation remaining. In which case the SPP will communicate the time deviation to the user in parallel with its respective TRANSITION.

The OUTPUT of the TBG deals with the PDE TRANSITION. Referring to FIG. 5, the TRANSITION control contains END OF PARCEL ("EOT") gates which set a FET switch array that fix a precision voltage of an OUTPUT DAC and a complimentary gate strobes the OUTPUT DAC through an inverter delay. The FET array sets a binary combination to the OUTPUT DAC. The inverter delay retards the timing of the strobe to the OUTPUT DAC while the FET array are set. The OUTPUT DAC's reference voltage is itself set by a REFERENCE DAC, which in turn, is itself calibrated to optimize the accuracy of the OUTPUT DAC. A voltage reference, $V_{REF}$ is supplied to the REFERENCE DAC equal to or better than the resolution of the LSB of the REFERENCE DAC. A switch array is set by calibration so as to weigh the LSB of the OUTPUT DAC to optimize the output of the REFERENCE DAC which is applied as the reference voltage, $V_{CAL}$ to the OUTPUT DAC.

The TRANSITION is effected through a calibrated DELAY defined as the PRECISION DELAY ENVELOPE ("PDE"). The PDE is a delay measured from the input of the EOT gate to a geometrical point of the output conductor designated by calibration as the ZERO CLOCK POINT ("ZCP"). As the designator implies, ZCP is the geometrical point from where time keeping of the instrument is referenced so as to accomadate subnanosecond timing.

That is, ZCP is a consequence of the physical size of the components and related circuitry, which among other things, is a distinct factor in true subnanosecond time-keeping. PDE nulls out the output delay of the TRANSITION control by enveloping a precision delay time slightly more than equal to the exact delay of EOT GATES and the OUTPUT DAC. Thus to effect a meaningful PDE, there must be a point of reference subsequent in time. The ZCP is a time subsequent to all component and related circuitry delays.

Figure 6:
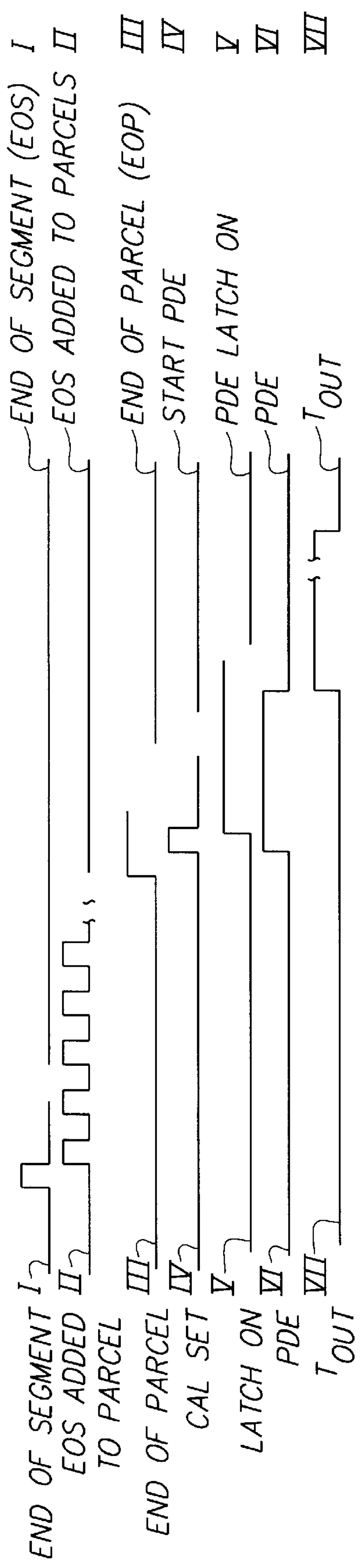
FIG. 6 shows the TRANSITION control timing diagram.

A TRANSITION control timing diagram, FIG. 6; shows the sequence of signals in relation to a SEGMENT, (FIG. 6-I); and EOS, which forms a series of PARCELS, (FIG. 6-II). FIG. 6-III shows the EOP (FIG. 6-IV) or last PARCEL, which in turn, starts PDE (FIG. 6-V) by enabling the PDE LATCH, not shown in FIG. 6. The PDE (FIG. 6-VI) is shown with respect to $T_{OUT}$ (FIG. 6-VII).

Now FIG. 6-VII is described in further detail in FIG. 5. The output of the delay designated SYNTHESIZED TRANSITION shows an analysis of the transition generated by the OUTPUT DAC. The x axis is Time, the y axis is Voltage. There are four levels shown; 1) the base level below $V_{pde1}$; 2) $V_{pde1}$; 3) $V_{pd2}$; and 4) a logical 1 level above $V_{pde2}$. The base level equates to a logical 0 or close to 0 volts. The OUTPUT DAC sets a level at about 1 volt. In a preferred embodiment, $V_{pde1}$ will be a precision voltage at 1 volt resolved to the resolution of the OUTPUT DAC. At a calibrated time in ns later, the OUTPUT DAC will switch its $V_{pde1}$ to $V_{pde2}$; a preferred voltage of 4 volts, shown in FIG. 5 as $T_{ROUT}$. The preferred time from $V_1$ to $V_2$ is 2 ns. The rise time from base to $V_1$, and the rise time from $V_2$ to logical need not be defined. The duration of the logical 1, $T_{trans}$, will be sufficiently long to permit the TRANSITION to return to logical 0, shown as $T_{RET}$, in FIG. 5.

Figure 8:
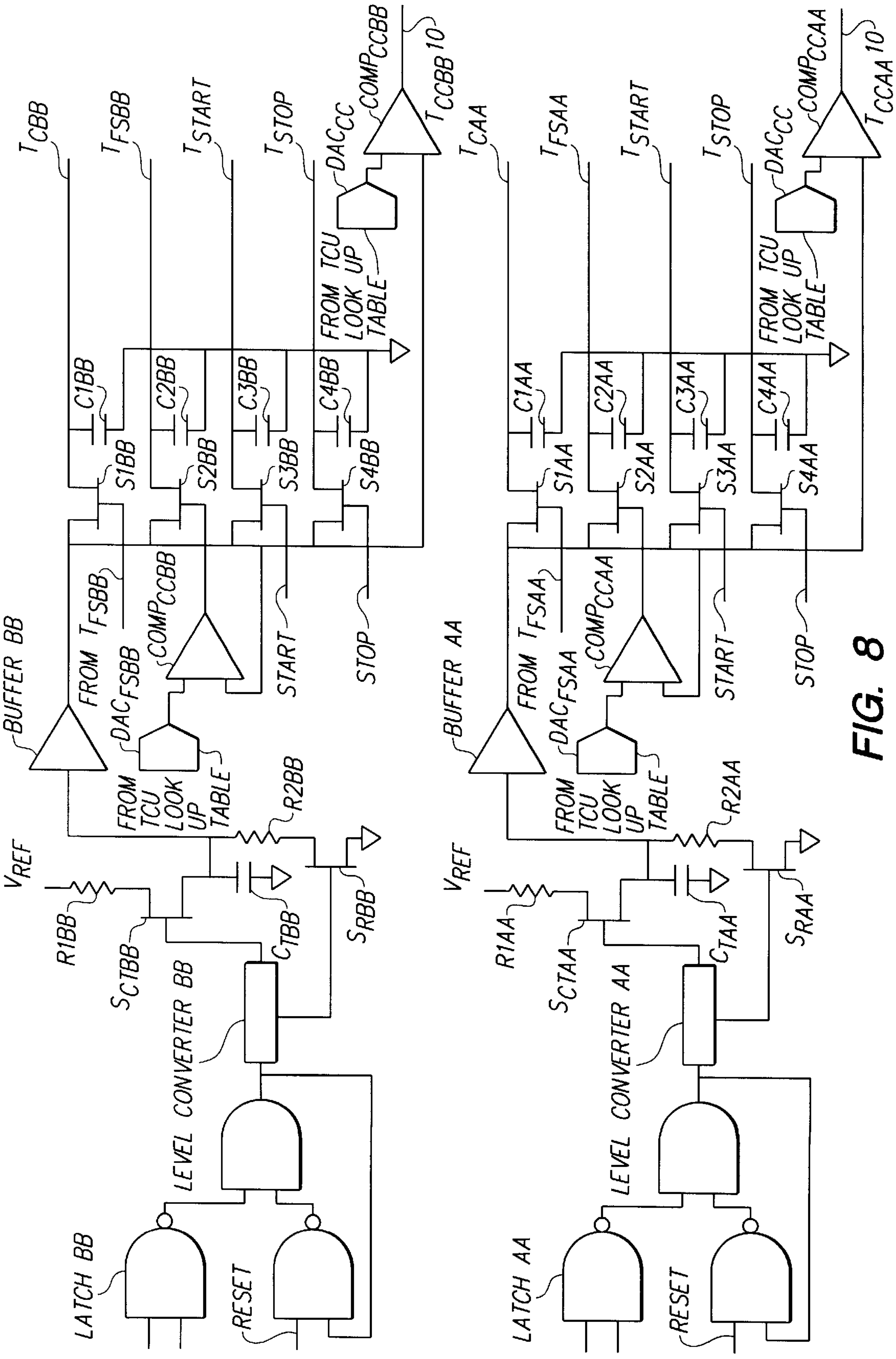
FIG. 8 shows a preferred embodiment of the CTU.
Figure 9:
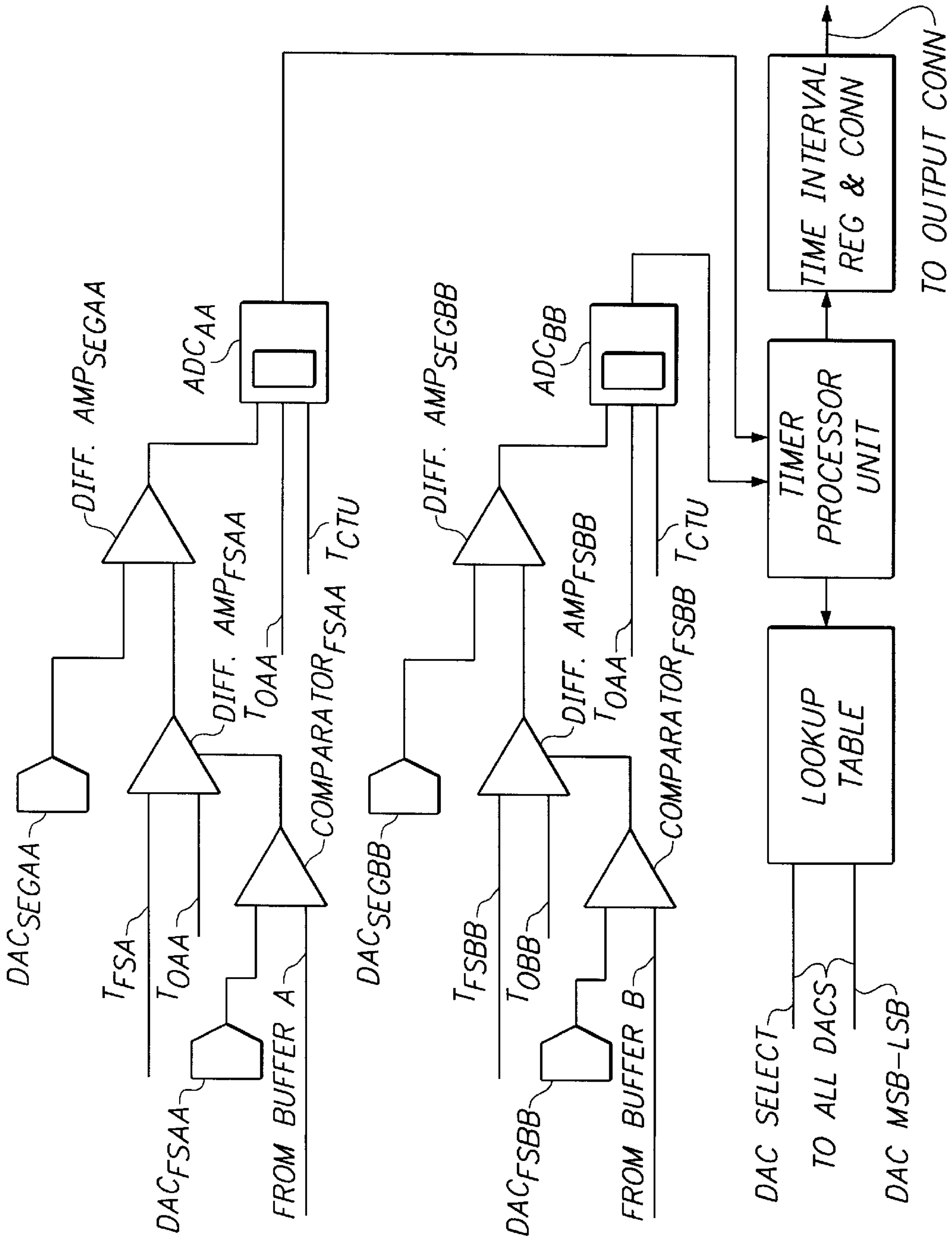
FIG. 9 shows another embodiment of the CTU.

A Preferred Embodiment of the CTU FIGS. 8 & 9

The functionality of the timing components as counterparts of the timing components in the TBG was described above. It follows then that the TIMER PROCESSOR UNIT (TPU) contains means that are functionally equivalent to the SPP, and thus, of all such embodiments described herein to keep time and control points of measurement and supervise accuracy. Accordingly, the LOOK UP TABLE is configured to a functional equivalent of its counterpart in the TBG so as to be able to support the TPI.

The TPU accumulates partial or complete SEGMENT(S) with PARCELS and TRANSITION optional. Such partial or complete SEGMENT(S) represent the TIME OF EVENT.

In the CTU at FIG. 9, SECTION A AND SECTION B each contains an S3 and an S4 with its respective tracking capacitors C3 and C4, to measure the point of charge of $C_T$ for connecting the START and STOP signals. The START signal input to SECTION A and SECTION B are connected together. Likewise the STOP signal input to SECTION A and SECTION B are also connected together. So that each respective measurement is wholly independent of the other.

Thus, the user can make minus event time measurements as well as positive event time measurements, because it is a "don't care" condition whether the STOP occurs before the STOP. In other words, the START-STOP designations are for convenience, one being of no greater weight of measurement than the other.

The TIME OF EVENT, $T_{START}-T_{STOP}$ is differentiated to a voltage level representing its absolute difference, a smaller signal may be multiplied by gain of the differential amplifier. In either case, the differentiated signal is applied directly to an ADC. The TPU selects the ADC most available to process the TIME OF EVENT.

The TPU supervises the conversion of the digitized data from V to T, the same as conversion is made in the TBG. The time data is presented by the TIME INTERVAL REG. & CONN to the user. One form of OUTPUT is a straight binary representation of time in picoseconds, latched at the connector in a 32 bit word for the user There are numerous standards and protocols known in the art for the outputing of data in this form.

Figure 10:
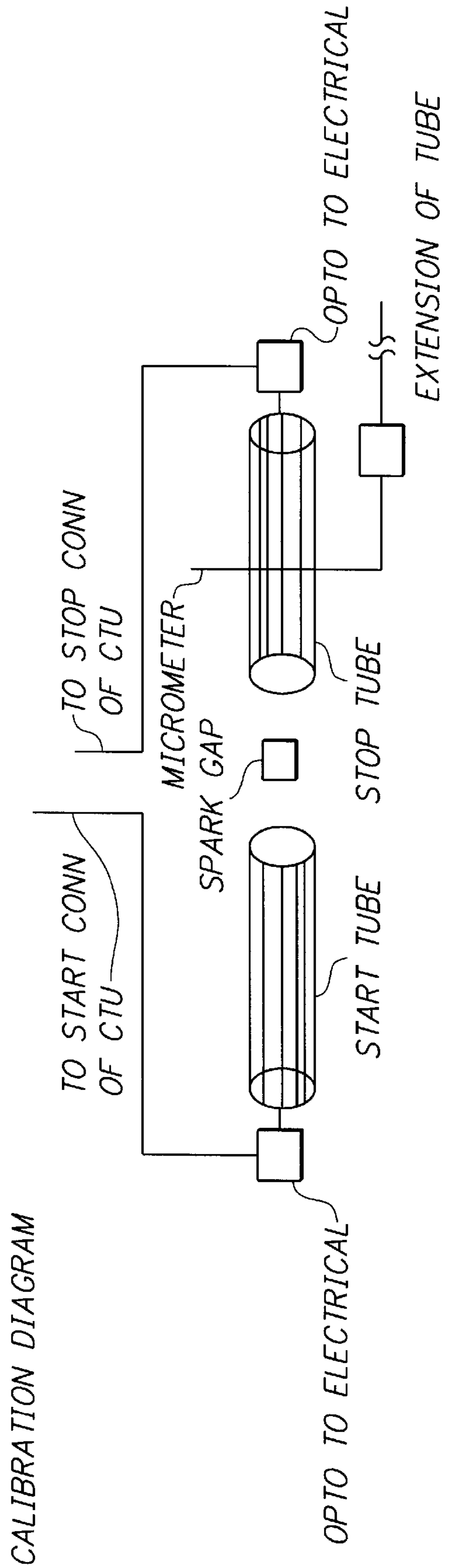
FIG. 10 shows a means for calibration.

A Preferred Embodiment of Calibration FIG. 10

Means for calibration are derived from a ratio delay of the speed of light, c and a precise distance, m. The ratio delay is calibrated against propagation velocity. The first step to fabricating a RATIO DELAY STANDARD is the construction of a 1/c standard. This standard is constructed out of two INVAR tubes. The two tubes are arranged so that means for a spark is provided equidistance as measured from the end of each tube. A spark is preferred. Alternately, other versions of the light source can be of any usable wavelength of a device, for example, a laser.

The output circuitry contains means for converting an optical signal, the spark across a gap, to an electrical signal. There are means known to the art for generating the spark gap, and means known to the art to convert an optical signal to an electrical signal. One output of the conversion circuitry of the two tubes is connected to the START input connector and the other is connected to the STOP input connector of the CTU. One tube then can be designated the START TUBE and the other the STOP TUBE.

The cables from the INVAR assembly to the input connector of the CTU are precisely equal in length. So that when the spark is lit-off by a voltage, the tubes being equidistance, the START and STOP points of measurement are enabled at the same time and the CTU outputs zero time. it shall be assumed that the CTU is in CALIBRATION MODE in this discussion.

Now the INVAR TUBE ASSEMBLY contains means for extending the length of the STOP TUBE. A preferred embodiment of the extension mechanism are means for micrometer adjustment and such micrometer adjustment contains further means for a high degree of adjustment precision. In just such an embodiment, the micrometer will extend the INVAR tube a distance of the tube known to be equal to a specific time. For example, the international standard for time to distance is 1/c where $c=2.99792458*10^8$ meters per second.

The STOP TUBE is extended by the micrometer to about 11.8" from its original equidistant position. The precise distance is computed in respect to the transit time of c over one foot, where the velocity, assuming the calculation is accurate, in a vacuum equals about 1016 ps. Calculation is then made to account for refraction of light in air per temperature; so that at a distance in the range of 11.8", equals exactly 1000 ps.

Now the CTU is calibrated so it will read out exactly 1000 ps. A three point check can be made to confirm linearity of the conversion from an exponential plot to time. For example, adjusting the STOP TUBE for various distances will read out proportionately to the distance equalling 1000 ps. There are other versions of this procedure. A cable ratio could be used, the light could be replaced with an electrical signal, and so forth. Additionally, the INVAR TUBE could be a appropriate stable material other than INVAR. And a TUBE could be of any geometric shape functional. Further, the DELAY STANDARD can be used to measure propagation in cables, calibrate the TBG or any other need for a precision time delay.

FIG. 11 is a flow chart showing a functional sequence common to the complimentary capacitors used in the TBG. The deignators utilized are generic. As such, the designators used throughout the specification $C_{TA}$ and $C_{TB}$ need only be shown as $C_T$. Likewise, such designators as $T_{FSA}$ and TFS need only be shown as $T_{FS}$. This generic designator scheme is carried through with such designators as the $T_{CC}$, $T_0$, $DAC_{FS}$ and so forth. As shown through out this specfication, the complimentary capacitor function in the TBG is identical in the TCU and therefore this flow chart of course is applicable to the TCU.

The purpose of this flow chart is to illustrate an overview of the processing function applied to the complimentary capacitors. Turning to FIG. 11, the LOOKUP descripter following the AWAIT+YES (after START $V_0$) is a look-up table or ROM with fixed address points so as to SET $T_{FS}$ and SET $T_{CC}$. See, for example, FIG. 2 showing how the components interconnect between the complimentary capacitors and the DACs. See also, for example, FIG. 7 showing the master timing relationship.

Figures 12A, 12B:
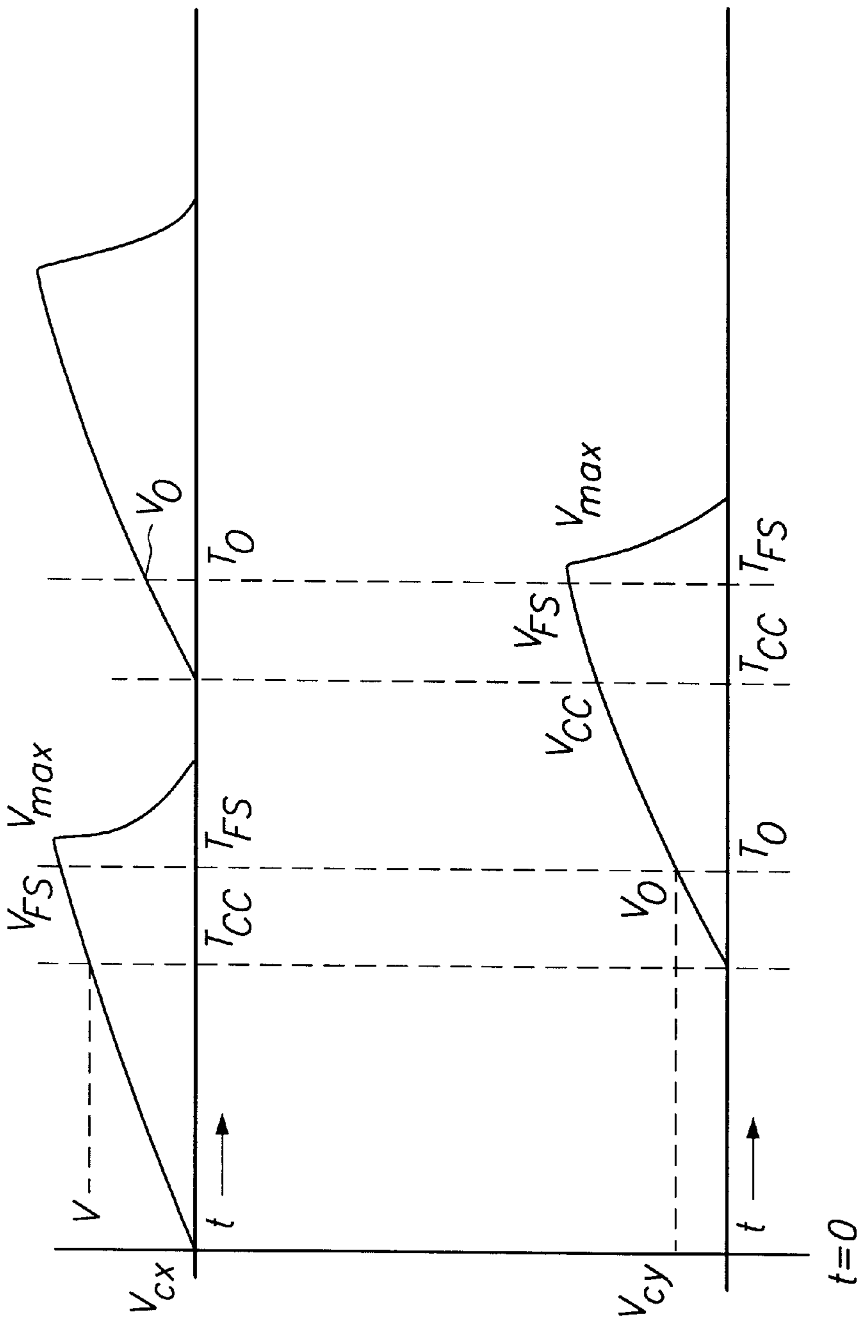
FIGS. 12A and 12B show the timing diagrams of complimentary capacitors.

Referring to FIGS. 12A and 12B, The start of the flow chart at START $C_T$ equates with $V_0$ in FIG. 8. The start of the flow chart at START $C_T$ equates with $V_0$ in FIG. B. Moving along, decision point $T_0$ at <YES> shows the processing of the absolute point of $T_0$ setting $T_{FS}$ and $T_{CC}$. At this point, there are two events occurring at the same time

Advantages of the Invention

This invention expands and improves the technology of electronic timing and real time clocks to thereby permit the control and acquisition of new and sophisticated information about a timed event of any duration in direct relationship to real time.

A key feature of this invention is that the self maintained calibration of the timer and real time clock. an electrical signal is derived from the speed of light. This derived electrical signal is utilized to effect repetitive calibration.

This invention employs sophisticated logic design and packaging that is less complex than previously existing technology. The result is a relatively inexpensive instrument. The timer is operated from its straightforward stop and start features that can be enabled manually or electrically.

Previously existing technology requires cesium based references which mandates very complex packaging. The reference that the time information be obtained from complex formulas through high level high speed microprocessors operated on multi-level software.

In contrast, this invention performs a simple integrated measurement of time intervals that additionally generates a real time function synchronized with an error correction process.

This invention is rugged, accurate, reliable easily calibrated and perform as time interval measurements in direct relationship to real time, thereby permitting time interval measurements of any duration. It can be adopted to any PC computer. It has immediate benefits for the applied engineering , chemical and medical fields.

Variations and modifications of the invention may be suggested by reading the specification and studying the drawings which are within the scope of the invention.

A major feature of the invention as illustrated in the foregoing paragraphs is a method of timing where an instant in time is marked by measuring a corresponding time-dependent quantity such as a voltage on a capacitor. The measurement is a dynamic measurement in the sense that the quantity (voltage) continues to change through the instant so that errors are not introduced by the act of interrupting the changing of the quantity. This is illustrated in the above discussion by using the charging potential at one instant to begin charging a second capacitor while the first capacitor continues to charge to its designated full charge potential.

Another important feature is the technique of this invention for "synchronizing" adjacent time periods. In the context of this invention, the term "synchronizing" is understood to mean the monitoring of each changing potential on the capacitors and adjusting the end potentials corresponding to the end of each time period to a value that is most probable as predicted by collective measurements of preceding end potentials. "Synchronizing" is accomplished preferably using a microprocessor for appropriate calculation of adjustment as described in this specification.

Sapphire capacitors are preferred for most precise measurements.

It will be understood that other "quantity" storage devices with different associated measuring components could be used other than simple measurement of a potential of a capacitor being charged. For example, in place of measuring the potential as a function of time, the charging current could be measured as a function of time. In place of pairs of capacitors, inductances could be used to obtain an electrical value. An optical value could be generated instead of an electrical value.

More than two quantity storage devices (capacitors) could be used in a continuous series for application in appropriate situations.

Calibrating device other than the pair of optical tubes may be contemplated. A calibrating device based on the use of microwaves and corresponding microwave detectors is one example. In view of these and other considerations, I therefore wish to define the scope of my invention by the appended claims.

I claim:

1. A time keeper system comprising:

(a) time component means for generating a plurality of successive component values, each of which is dependent on time;

(b) means for making a series of measurements of each of said values, each measurement marking an end of one time period and the beginning of another time period contiguous with said one time period with said series of measurements corresponding to a series of continguous time periods corresponding to real time, said measurement having deviations;

(c) means for compensating for accumulated deviations in said measurements; and (d) means for processing said series of component values as compensated.

2. The system of claim 1 wherein:

(a) said time component means is a capacitor means for storing a charging potential value;

(b) each of said values is said potential value;

(c) said means for making said series of measurements comprises:

(d) means for tracking said potential value to where said potential value equals an end potential whereby an end of said one time period is indicated;

(e) means for holding said end potential value;

(f) further including means for synchronizing as part of said means for compensating, comprising:

(g) means for calculating correction of said end potential value using preceding values from corrected earlier ones of said corrected end values; and (h) means for applying said correction to said end potential value whereby a corrected end value is obtained.

3. The system of claim 2 wherein said means for making a series of measurements comprises means for relating said end potential value to a time value whereby an exponential relation between said end potential and time is converted to a linear relation.

4. The system of claim 3 comprising:

(a) said capacitor means being a plurality of capacitors;

(b) each said capacitor having a charge potential value representing a period of time beginning at a preselected instant defined as being when said charge potential value is zero;

(c) said potential value of each said capacitor having a range of values extending from zero corresponding to said preselected instant to a maximum value corresponding to a maximum period;

(d) each said capacitor having detection means connecting each said capacitor to another said capacitor and detecting said charge potential value of said another capacitor whereby said plurality of component means forms an array of continuous connected capacitors;

(e) each said detection means having means for setting said potential value of said respective capacitor means equal to zero when said potential value of said another capacitor equals a preselected first potential value;

(f) each said detection means having means for measuring a potential value of said another capacitor when said potential value of said one capacitor equals a preset second value of potential, said measured potential being said end potential; and (g) said means for holding including a holding capacitor connected to hold said end potential value for a period of time that is shorter than said maximum period.

5. The system of claim 4 wherein said means for relating said end potential value to said period of time comprises:

(a) means for converting said end potential value in said holding capacitor from an analog expression to a digital expression;

(b) a lookup table being a table listing potential value, V, equal to $V_0(1-e^{-åt})$ vs. t where t represents time, $V_O$ represents a maximum charging potential value, and å represents a time constant wherein all entries of V and t in said lookup table are expressed in digital 00form;

(c) means for selecting from said lookup table a value of end time corresponding to said end potential value;

(d) means for subtracting said value of end time from a value of start time corresponding to said preset second value of potential whereby a value of said period is calculated.

6. The system of claim 5 wherein said means for calculating correction comprises:

(a) means for storing said value of said period;

(b) means for applying an algorithm to compute a correction factor from said stored value of said period and a group of periods measured during preceding periods;

(c) said correction factor being one of a positive and negative quantity;

(d) means for adding said correction factor to said value of said period whereby a corrected value of said period is calculated.

7. The system of claim 6 wherein said means for applying said algorithm comprises:

(a) means for calculating a summation of periods by adding a group of corrected periods where said group includes a preset quantity of successive periods beginning with a beginning period and ending with said period;

(b) means for dividing said summation by said quantity whereby a corrected period is calculated;

(c) means for substituting said corrected period for said period.

8. The system of claim 6 which comprises:

(a) start gate means for receiving a start signal and providing starting of a series of contiguous time periods;

(b) stop gate means for receiving stop signals;

(c) output terminals where appears a signal representing a time indicating time of stopping said series of contiguous time periods.

9. The system of claim 1 which comprises means for marking real time by said series of contiguous time periods.

10. The system of claim 2 which comprises means for marking real time by said series of contiguous time periods.

11. The system of claim 4 comprising means for marking real time by said series of contiguous time periods.

12. The system of claim 11 wherein said means for marking real time by said series of contiguous time periods comprises:

(a) terminal means for receiving a continuing series of input signals;

(b) each input signal representing a segment of time;

(c) means for computing a total number of signals received, said total number representing real time.

13. The system of claim 2 which comprises means for calibrating said system.

14. The system of claim 13 wherein said means for calibrating comprises:

(a) a pair of wave guide tubes constructed to provide that light can enter one end of each said tube and pass out another end of said respective tube;

(b) said tubes positioned in line and end to end with respect to one another wherein two adjacent ends are separated by a space;

(c) one said tube being longer than said other tube by a length difference;

(d) a light emitting means positioned in said space;

(e) a pair of light detectors, one said detector positioned at one end of one said tube opposite said end adjacent to said light source and another said detector positioned at one end of said another tube opposite said end adjacent to said light source providing that, when a pulse of light is generated, by said light source, one said detector will emit a signal at a time later than a pulse emitted by said other detector by a time period that equals a difference of length of said two tubes divided by the velocity of light.

15. The system of claim 14 wherein said light emitting source is a spark generator.

16. The system of claim 2 wherein said plurality of capacitors is two capacitors.

17. The system of claim 16 wherein said two capacitors are sapphire capacitors.

18. The system of claim 8 wherein said output terminals are connected to said start terminal of the system of claim 12.

19. The system of claim 2 wherein said capacitor means comprises:

(a) a charging capacitor connected through a charging switch to a reference potential; and connected through a discharging switch to ground;

(b) a level converter means for applying signals to control terminals of said charging switch and discharging switch;

(c) said level converter having one output connected to said a controlling terminal of said charging switch and another output connected to a controlling terminal of said discharging switch whereby said capacitor charges when said level converter closes said charging switch and discharges when said level converter closes said ground switch;

(d) a latch means connected to said level controller and having set and reset terminals for controlling polarities of said level converter.

20. The system of claim 2 wherein said means for tracking and said means for holding comprises:

(a) an end potential holding capacitor connected to said charging capacitor means through a potential holding switch;

(b) a comparator having an output connected to a controller terminal of said potential holding switch;

(c) said comparator means having a pair of input terminals;

(d) one said terminal of said terminal adapted for connection to an output terminal of a complementary capacitor means and another input terminal adapted for connection to a reference potential.

21. A time base generator comprising:

(a) a pair of capacitors for storing a charging potential value on each capacitor;

(b) means for tracking said potential value on each capacitor to where said potential value on each capacitor equals an end potential whereby an end of one time period is indicated;

(c) means for holding said end potential value;

(d) means for succesively calculating correction of end potential values using corrected earlier ones of said corrected end potential values;

(e) means for applying said correction to said end potential value whereby a corrected end value is obtained;

(f) means for relating said end potential value to a time value whereby an exponential relation between said end potential and time is converted to a linear relation;

(g) said charge potential value on each capacitor representing a period of time beginning at a preselected instant defined as being when said charge potential value is zero;

(h) said potential value of each said capacitor occurring in a range of values extending from zero corresponding to said preselected instant to a maximum value corresponding to a maximum period;

(i) each said capacitor having detection means connecting each said capacitor to other said capacitor and detecting said charge potential value of said other capacitor;

(j) each said detection means having means for setting said potential value of said respective capacitor equal to zero when said potential value of said other capacitor equals a preselected first potential value;

(k) each said detection means having means for measuring a potential value of said other capacitor when said potential value of said one capacitor equals a preset second value of potential, said measured potential being said end potential; and (l) a holding capacitor connected to hold said end potential value for a period of time that is shorter than said maximum period;

(m) processor means for marking real time from said series of contiguous time periods;

(n) start signal means for initiating a charging cycle of one of said capacitors whereby said time base generator begins marking time;

(o) stop signal means for interrupting and holding charge potential on one of said capacitors whereby said time and base generator cases to mark time;

(p) means for providing a sum of end potential measurements accumulated between time of said start signal and said stop signal.

22. A calibrated timer unit which comprises:

(a) a pair of capacitors, each capacitor for storing a charging potential value;

(b) means for tracking said potential value to where said potential value equals an end potential failure whereby an end of one time period is indicated;

(c) means for holding said end potential value;

(d) means for calculating correction of said end potential value using preceding values from corrected earlier ones of said corrected end values;

(e) means for applying said correction to said end potential value whereby a corrected end value is obtained;

(f) means for relating said end potential value to a time value whereby an exponential relation between said end potential and time is converted to a linear relation;

(g) a charge potential value on each capacitor representing a period of time beginning at a preselected instant defined as being when said charge potential value is zero;

(h) said potential value of each said capacitor occurring in a range of values extending from zero corresponding to said preselected instant to a maximum value corresponding to a maximum period;

(i) each said capacitor having detection means connecting each said capacitor to other said capacitor and detecting said charge potential value of said other capacitor;

(j) each said detection means having means for setting said potential value of said respective capacitor means equal to zero when said potential value of said another capacitor equals a preselected first potential value;

(k) each said detection means having means for measuring a potential value of said other capacitor when said potential value of said one capacitor equals a preset second value of potential, said measured potential being said end potential; and (l) said means for holding including a holding capacitor connected to hold said end potential value of each capacitor for a period of time that is shorter than said maximum period;

(m) means for converting said end potential value in said holding capacitor from an analog expression to a digital expression;

(n) a lookup table being a table listing potential value, V, equal to $V_o(1-e^{-åt})$ vs. t where t represents time, $V_o$ represents a maximum charging potential value, and å represents a time constant wherein all entries of V and t in said lookup table are expressed in digital form;

(o) means for selecting from said lookup table a value of end time corresponding to said end potential value;

(p) means for subtracting said value of end time from a value of start time corresponding to said preset second value of potential whereby a value of said period is calculated;

(q) means for storing said value of said period;

(r) means for applying an algorithm to compute a correction factor from said stored value of said period and a group of periods measured during preceding periods;

(s) said correction factor being one of a positive and negative quantity;

(t) means for adding said correction factor to said value of said period whereby a corrected value of said period is calculated;

(u) start gate means for receiving a start signal and displaying a time of starting a series of a series of contiguous time periods;

(v) stop gate means for receiving a stop signals;

(w) output terminals where appears a signal representing a time indicating time of stopping said series of contiguous time periods.

23. A method for keeping total time of a series of contiguous time periods which includes the steps in operable order:

(a) connecting a first capacitor to a charging source whereby said first capacitor begins to charge:

(b) monitoring the potential on said first capacitor and when such potential on said first capacitor reaches a first preset value, connecting a second capacitor to a charging source;

(c) monitoring the potential on said second capacitor and when such potential on said second capacitor reaches a second preset value, measuring a full scale potential on said first capacitor;

(d) connecting said first capacitor to discharge when potential on said first capacitor reaches a preset maximum value;

(e) connecting said first capacitor to charge when said second capacitor reaches said first preset potential value;

(f) recording a singular time corresponding to one time period of said series of contiguous time periods as being represented by said full scale potential minus said first preset potential value;

(g) repeating steps (b) through (f) thereby creating a sum of potential differences representing said total time, said potential differences having deviations; and (h) compensating for accumulated deviations in said sum of potential differences representing said total time.

24. A time base generator having a variable cycle time comprising:

(a) a pair of capacitors for storing a charging potential value on each capacitor;

(b) a pair of variable resistors, each said resistor connected across one of said capacitances, respectively whereby charging rate of each capacitor is adjustable separately, (c) means for tracking said potential value on each capacitor to where said potential value on each capacitor equals an end potential whereby an end of said one time period is indicated;

(d) means for holding said end potential value;

(e) means for successively calculating correction of end potential values using corrected earlier ones of said corrected end potential values;

(f) means for applying said correction to said end potential value whereby a corrected end value is obtained;

(g) means for relating said end potential value to a time value whereby an exponential relation between said end potential and time is converted to a linear relation;

(h) said charge potential value on each capacitor representing a period of time beginning at a preselected instant defined as being when said charge potential value is zero;

(i) said potential value of each said capacitor occurring in a range of values extending from zero corresponding to said preselected instant to a maximum value corresponding to a maximum period;

(j) each said capacitor having detection means connecting each said capacitor to other said capacitor and detecting said charge potential value of said other capacitor;

each said detection means having means for setting said potential value of said respective capacitor equal to zero when said potential value of said other capacitor equals a preselected first potential value;

(k) each said detection means having means for measuring a potential value of said other capacitor when said potential value of said one capacitor equals a preset second value of potential, said measured potential being said end potential; and (l) a holding capacitor connected to hold said end potential value for a period of time that is shorter than said maximum period;

(m) processor means for marking real time from said series of contiguous time periods;

(n) start signal means for initiating a charging cycle of one of said capacitors whereby said time base generator begins marking time;

(o) stop signal means for interrupting and holding charge potential on one of said capacitors whereby said time and base generator cases to mark time;

(p) means for providing a sum of end potential measurements accumulated between the time of said start signal and said stop signal.

25. A device for generating a succession of delayed signals, said device comprising:

(a) a plurality of capacitors;

(b) each said capacitor having a charge potential value representing a period of time beginning at a preselected instant defined as being when said charge potential value is zero;

(c) said potential value of each said capacitor having a range of values extending from zero corresponding to said preselected instant to a maximum value corresponding to a maximum period;

(d) each said capacitor having detection means connecting each said capacitor to another capacitor and detecting the charge potential value of said another capacitor whereby said plurality of component means forms an array of continuous connected capacitors;

(e) each said detection means having means for setting said potential value of said respective capacitor means equal to zero when said potential value of said another capacitor equals a preselected first potential value;

(f) each said detection means having means for measuring a potential value of said another capacitor when said potential value of said one capacitor equals a preset second value of potential, said measured potential being said end potential;

(g) a plurality of terminals, one terminal connected to each capacitor, whereby when a beginning one of said capacitors is charged, charging of said capacitors proceeds around said array of continuous connected capacitors whereby a signal appears at each terminal at a time determined by a number of capacitors the signal having deviation; and (h) means for compensating for accumulated errors in said signal.

* * * * *